(12) United States Patent
Sills

(10) Patent No.: US 8,268,732 B2
(45) Date of Patent: Sep. 18, 2012

(54) METHODS OF UTILIZING BLOCK COPOLYMERS TO FORM PATTERNS

(75) Inventor: Scott Sills, Boise, ID (US)

(73) Assignee: Micron Technology, Inc., Boise, IA (US)

( * ) Notice: Subject to any disclaimer, the term of this patent is extended or adjusted under 35 U.S.C. 154(b) by 355 days.

(21) Appl. No.: 12/621,768

(22) Filed: Nov. 19, 2009

(65) Prior Publication Data

US 2011/0117733 A1    May 19, 2011

(51) Int. Cl.
*H01L 21/312* (2006.01)

(52) U.S. Cl. . 438/780; 438/514; 438/694; 257/E21.231; 257/E21.346; 977/888; 977/895

(58) Field of Classification Search ............... 438/780, 438/514, 694; 257/E21.231, E21.346; 977/888, 977/895

See application file for complete search history.

(56) References Cited

U.S. PATENT DOCUMENTS

| | | | |
|---|---|---|---|
| 3,711,839 A | 1/1973 | Sell et al. | |
| 5,578,840 A | 11/1996 | Scepanovic et al. | |
| 5,874,760 A | 2/1999 | Burns, Jr. et al. | |
| 8,147,914 B2* | 4/2012 | Jung et al. | 977/888 |
| 2004/0077156 A1 | 4/2004 | Tsakalakos et al. | |
| 2007/0293041 A1 | 12/2007 | Yang et al. | |
| 2009/0092803 A1 | 4/2009 | Bita et al. | |
| 2009/0130380 A1 | 5/2009 | Asakawa et al. | |
| 2009/0168480 A1 | 7/2009 | Scheuerlein et al. | |
| 2009/0170030 A1 | 7/2009 | Scheuerlein et al. | |
| 2009/0305173 A1* | 12/2009 | Xiao et al. | 430/324 |

OTHER PUBLICATIONS

Hong, K. M. and Noolandi, J., "The effect of polydispersity on the microphase separation of a block copolymer system", Polymer Communications, Sep. 1984, pp. 265-268, vol. 25.

Spontak, Richard J. and Williams, Michael C., "Prediction of Microstructures for Polydisperse Block Copolymers, Using Continuous Thermodynamics", Journal of Polymer Science: Part B: Polymer Physics, vol. 28, 1379-1407 (1990).

Cooke, David M. and Shi, An-Chang, "Effects of Polydispersity on Phase Behavior of Diblock Copolymers", Macromolecules 2006, 39, 6661-6671.

Nguyen, Diep et al., "Effect of Ionic Chain Polydispersity on the Size of Spherical Ionic Microdomains in Diblock Ionomers", Macromolecules 1994, 27, 5173-5181.

Noro, Atsushi et al., "Chain Localization and Interfacial Thickness in Microphase-Separated Structures of Block Copolymers with Variable Composition Distributions", Macromolecules 2006, 39, 7654-7661.

Torikai, Naoya et al., "Neutron Reflection Studies on Lamellar Microphase-Separated Structures of Two-Component Block Copolymers with Composition Distribution", Physica B 385-386 (2006) 709-712.

(Continued)

*Primary Examiner* — Mary Wilczewski
*Assistant Examiner* — Toniae Thomas
(74) *Attorney, Agent, or Firm* — Wells St. John P.S.

(57) ABSTRACT

Some embodiments include methods of forming patterns utilizing copolymer. A copolymer composition is formed across a substrate. The composition includes subunits A and B, and will be self-assembled to form core structures spaced center-to-center by a distance of $L_0$. The core structures are contained within a repeating pattern of polygonal unit cells. Distances from the core structures to various locations of the unit cells are calculated to determine desired distributions of subunit lengths.

35 Claims, 28 Drawing Sheets

OTHER PUBLICATIONS

Ellison, Christopher J., "Bicontinuous Polymeric Microemulsions from Polydisperse Diblock Copolymers", The Journal of Physical Chemistry B, 2009, 113 (12), 3726-3737, Publication Date Dec. 16, 2008.

Lynd, Nathaniel A. et al., "Polydispersity and block copolymer self-assembly", Progress in Polymer Science, Aug. 23, 2008, pp. 875-893, vol. 33, Elsevier Ltd.

\* cited by examiner

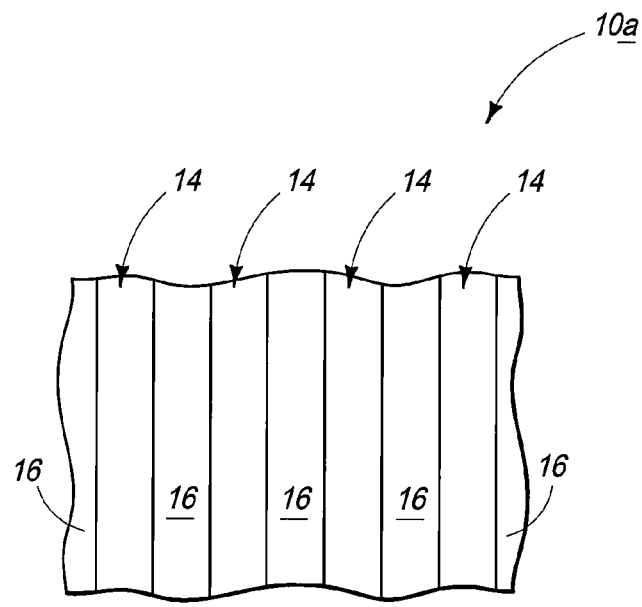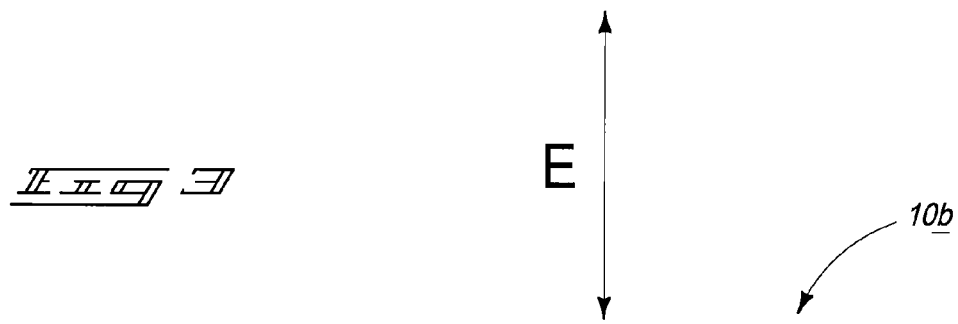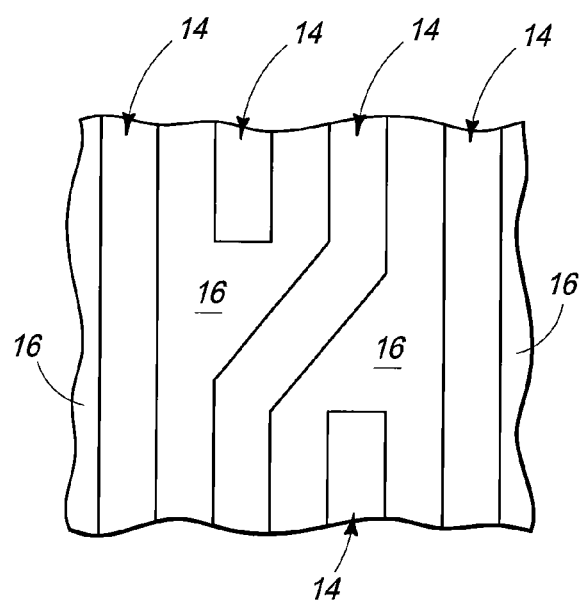

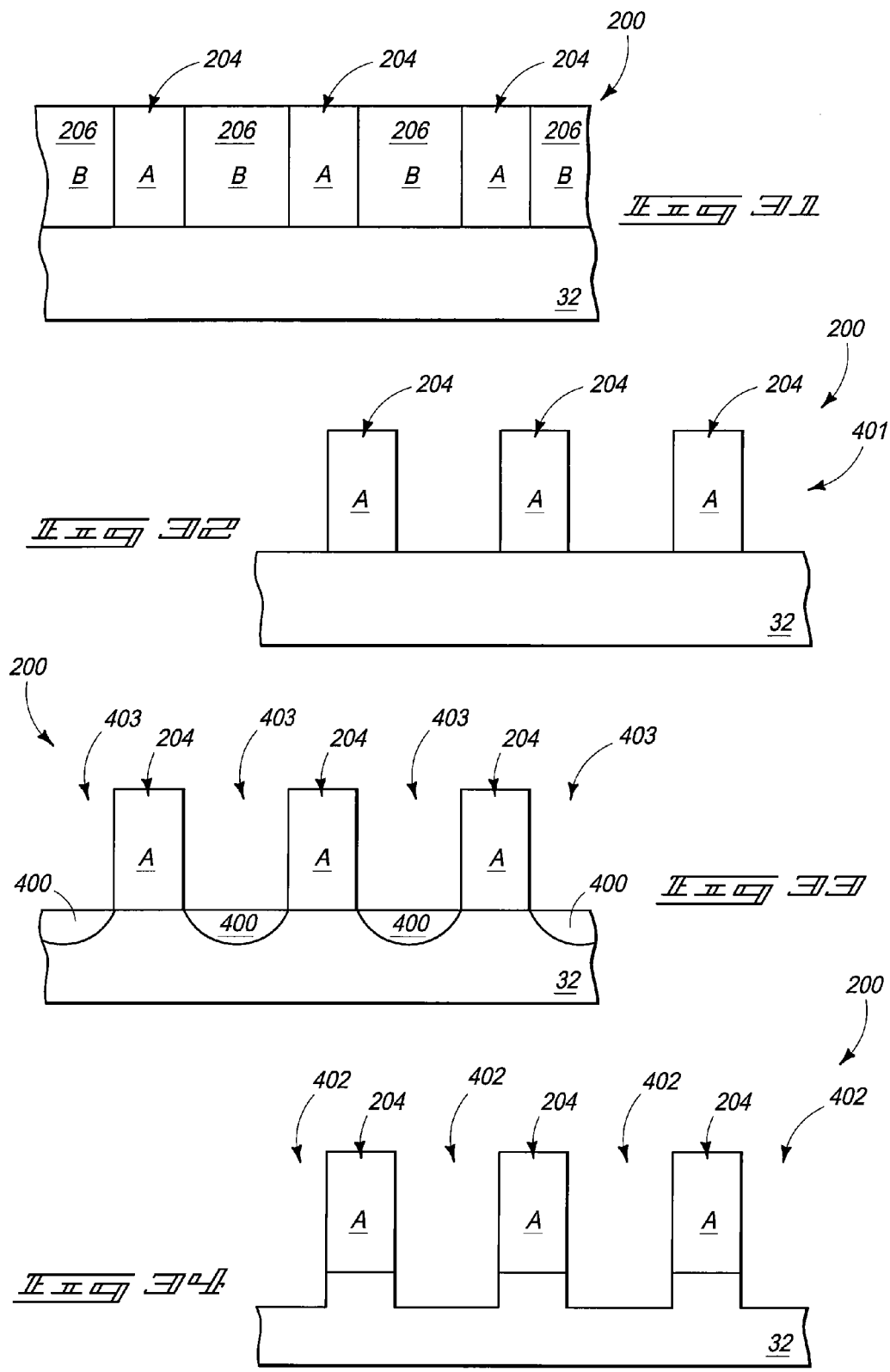

METHODS OF UTILIZING BLOCK COPOLYMERS TO FORM PATTERNS

TECHNICAL FIELD

Methods of utilizing block copolymers to form patterns.

BACKGROUND

Numerous applications exist in which it is desired to form repeating patterns having a small pitch (for example, a pitch of less than about 50 nanometers). For instance, integrated circuit fabrication may involve formation of a repeating pattern of memory-storage units (i.e., NAND unit cells, dynamic random access memory [DRAM] unit cells, cross-point memory unit cells, etc.).

A variety of methods have been developed for creating patterned masks suitable for patterning underlying materials during fabrication of integrated circuit components. A continuing goal of integrated circuit fabrication is to increase integrated circuit density, and accordingly to decrease the size of individual integrated circuit components. There is thus a continuing goal to form patterned masks having increasing densities of individual features. In cases in which the patterned masks comprise repeating patterns of features, there is a continuing goal to form the repeating patterns to higher density, or in other words, to decrease the pitch.

A method showing some promise for creating repeating patterns to high density involves utilization of block copolymer to form the repeating pattern. Unfortunately, there are often numerous defects present in the repeating patterns formed with block copolymers. It would be desirable to develop new methods of forming patterns with block copolymers which enable repeating patterns to be formed to high density, and with fewer defects than are presently formed with conventional methods.

BRIEF DESCRIPTION OF THE DRAWINGS

FIG. 3 shows diagrammatic cross-sectional top views of a construction comprising copolymer with a desired pattern therein, and of a construction comprising the copolymer with a non-desired pattern therein.

FIG. 6A is an expanded view of a section of FIG. 6.

FIG. 31 is a cross-sectional view of a portion of the construction of FIG. 24.

FIG. 32 is a view of the construction of FIG. 31 shown at a processing stage subsequent to that of FIG. 31, and specifically after a portion of block copolymer has been removed to form a patterned mask.

FIG. 33 shows the construction of FIG. 31 at a processing stage subsequent to that of FIG. 32, and specifically after the patterned mask has been used to define a pattern for implanting dopant into a substrate underlying the mask.

FIG. 34 shows the construction of FIG. 31 at a processing stage subsequent to that of FIG. 32, and specifically after the patterned mask has been used to define a pattern for an etch into a substrate underlying the mask.

DETAILED DESCRIPTION OF THE ILLUSTRATED EMBODIMENTS

Copolymers are polymers derived from two or more monomeric species, and contain two or more homopolymer subunits linked by covalent bonds. The union of the homopolymer subunits may utilize an intermediate linkage, known as a junction block.

The embodiments described herein may utilize block copolymers. Block copolymers may be in the form of diblock copolymers, triblock copolymers, etc. Example diblock copolymers include polystyrene-b-poly (2-vinylpyridine) (PS-b-P2VP); polystyrene-b-poly(ethylene oxide) (PS-b-PEO); polystyrene-b-poly(methylmethacrylate) (PS-b-PMMA); polystyrene-b-poly(dimethyl-siloxane) (PS-b-PDMS). The "b" utilized in each of the above chemical formulas indicates a block linkage. Other example block copolymers include materials discussed in U.S. Patent Publication No. 2007/0293041.

Diblock copolymers may be generically represented as A-B, where the "A" represents one of the homopolymer subunits, the "B" represents the other of the homopolymer subunits, and the hyphen represents a covalent bond.

A useful property of some block copolymers is that the homopolymer subunits of the copolymers preferentially interact with like subunits, and avoid interactions with dissimilar subunits. For instance, in some diblock copolymers (A-B), the subunits A preferentially interact with other A, the subunits B preferentially interact with other B, and the subunits A and B preferentially avoid interactions with one another; depending on various factors, such as the length of the blocks, the overall volume fraction of each block, Flory-Huggins interactions, etc. The copolymers may thus self-assemble into repeating patterns. For instance, some diblock copolymers may self-assemble into a repeating pattern that may be represented as A-B:B-A:A-B:B-A:A-B. In such pattern, the hyphens represent covalent bonds and the colons represent non-covalent interactions. The self-assembly of copolymers may be utilized to form patterns over substrates.

Figure 1:
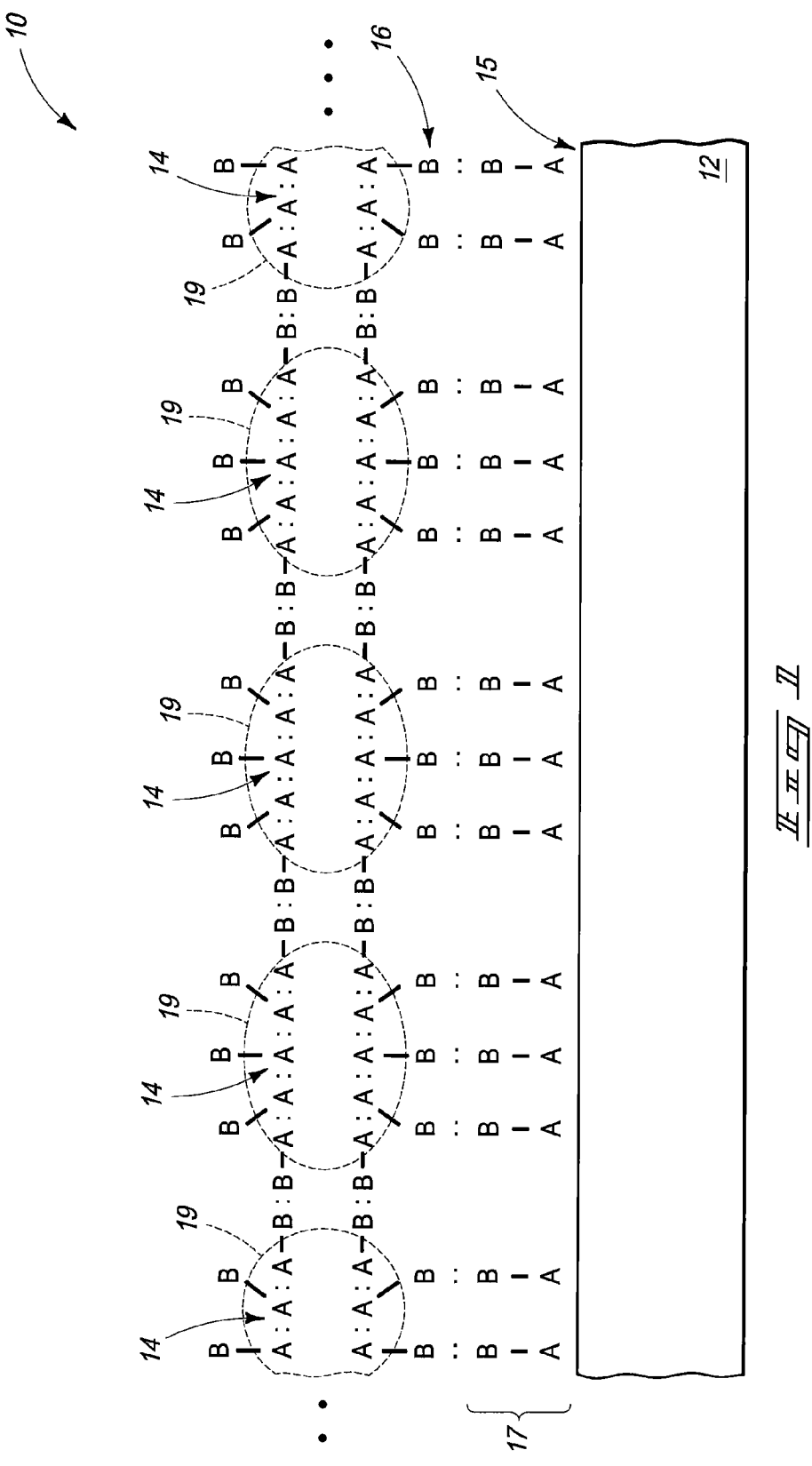
FIG. 1 is a diagrammatic representation of a pattern formed by assembly of diblock copolymer.

FIG. 1 shows a construction 10 comprising a base 12 having a diblock copolymer pattern extending thereover.

Base 12 may comprise, for example, a monocrystalline semiconductor wafer (for example, a monocrystalline silicon wafer), either alone or in assemblies with other materials. If the base comprises monocrystalline silicon, the base may be referred to as a semiconductor substrate. The terms "semiconductive substrate" and "semiconductor substrate" as utilized herein mean any constructions comprising semiconductive material, including, but not limited to, bulk semiconductive materials such as semiconductive wafers (either alone or in assemblies comprising other materials thereon), and semiconductive material layers (either alone or in assemblies comprising other materials). The term "substrate" as used herein refers to any supporting structure, including, but not limited to, semiconductive substrates.

The base 12 has an upper surface 15 to which subunit A of the diblock copolymer has more affinity than does subunit B of the copolymer, (for instance, surface 15 may be more wettable by subunit A than by subunit B). The diblock copolymer is provided over surface 15 in a solution (or other appropriate mixture) so that the diblock copolymer may assemble in a preferred orientation during subsequent annealing. Accordingly, in the shown embodiment the diblock copolymer orients so that subunits A are directed toward surface 15. The first layer of A-B copolymer along surface 15 may be referred to as a brush layer 17 (in other embodiments, there may be no brush layer). Additional levels of A-B copolymer are formed over the brush layer during self-assembly of the copolymer.

The self-assembly of the copolymer may be induced by any of various methods known in the art, such as, for example, thermal or solvent annealing of the copolymer. If solvent annealing is utilized, such may correspond to an anneal induced with solvent vapor.

The self-assembly has formed a pattern comprising regions 14 of A subunits (demarcated by dashed lines 19 in FIG. 1), surrounded by a region 16 of B subunits. The regions 14 may be referred to as "core" structures. The core structures may have any of numerous shapes. In some embodiments, the core structures may be linear structures (for instance, cylinders) that extend in and out of the page relative to the cross-sectional view of FIG. 1. In some embodiments, the core structures may be spherical micelles. The outer edges of the core structures (i.e., the boundaries demarcated by dashed lines 19) are defined by interfaces where the A subunits of the core structures are directly adjacent the B subunits of the surrounding region.

Although the surrounding region is shown to be the B subunits and the core structures are shown to be the A subunits, in other embodiments the pattern may be reversed so that the surrounding region contains the A subunits and the core structures contain the B subunits.

Figure 2:
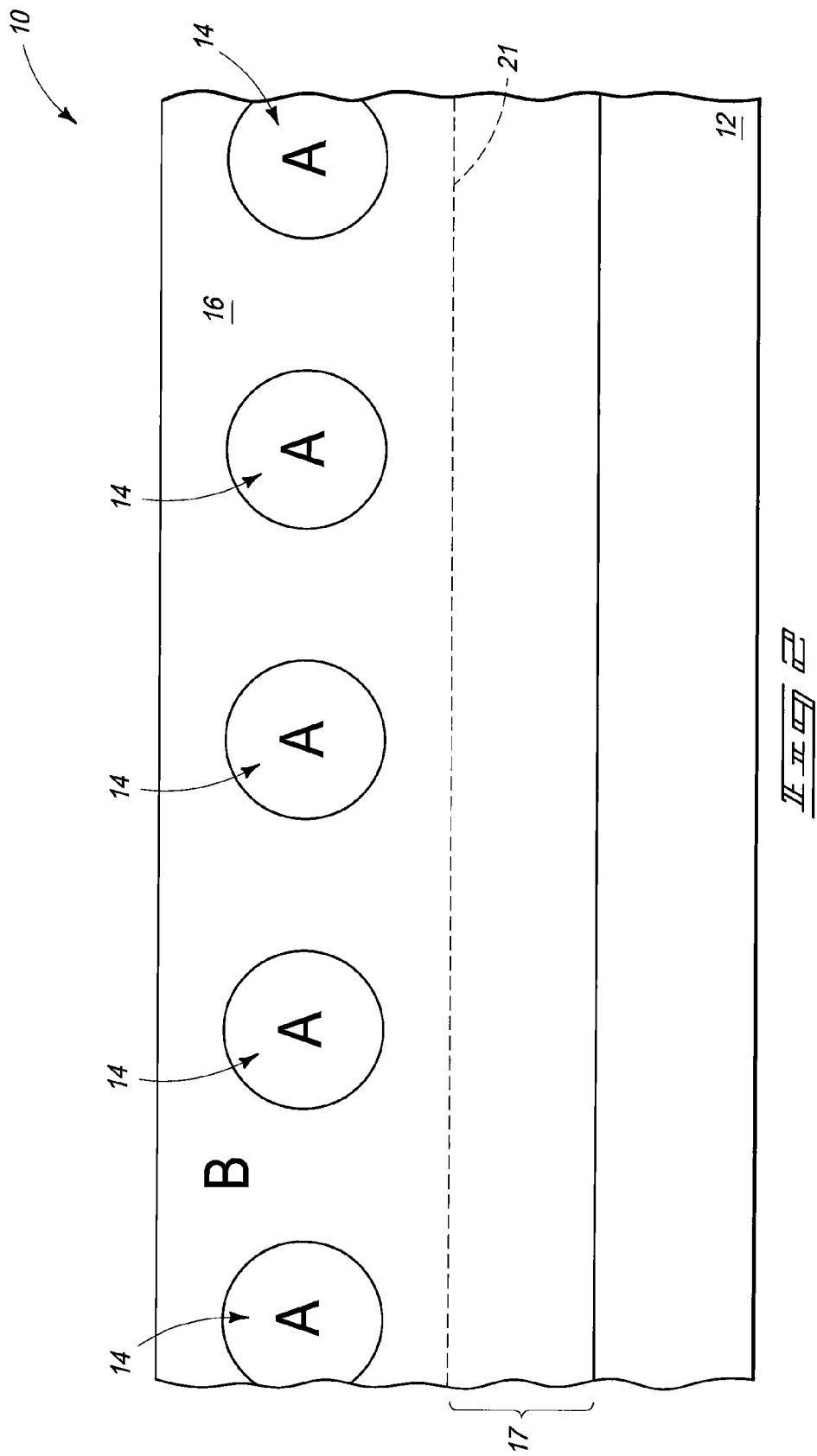
FIG. 2 is another diagrammatic representation of the pattern shown in FIG. 1.

The pattern of FIG. 1 may be diagrammatically represented with the simplified drawing shown in FIG. 2. A boundary between the brush layer 17 and the B subunit region 16 is represented with a dashed line 21 in FIG. 2. The simplified drawing type of FIG. 2 will be used to describe many of the example embodiments presented herein in order to render the description of such embodiments to be more straightforward than would occur if the more complex drawing type of FIG. 1 were utilized.

As mentioned above, the process of forming a pattern with copolymer (for instance, block copolymer) may involve two specific steps. First the copolymer may be spread across a base (for instance, a semiconductor substrate), and second the copolymer may be treated to induce self-assembly of a pattern within the copolymer (the treatment may utilize any process suitable to induce self-assembly within the copolymer, and may utilize, for example, a thermal anneal, a solvent anneal, and/or a process yet to be developed).

FIG. 3 shows a top view of a construction 10a corresponding to a desired configuration resulting from self-assembly of block copolymer, and shows a construction 10b having an undesired configuration formed by the self-assembly of the block copolymer. In the desired configuration of 10a, the core structures 14 are all identical to one another, extend parallel to one another, and extend parallel to an upper surface of substrate 12. In contrast, some of the structures 14 of construction 10b have merged together and formed a pattern defect. The type of pattern defect illustrated in the construction of 10b is referred to as a pair of dislocations. The constructions 10a and 10b are shown to be interchangeable with one another if energy (represented by the symbol "E") is introduced into the system.

The configuration of 10a in which the core structures all extend parallel to one another may be thermodynamically favored relative to other configurations in which some of the core structures are not parallel to others. However, although the favored thermodynamic configuration may correspond to a global energy minimum for the system corresponding to construction 10a, there may be other localized energy wells corresponding to configurations in which one or more of the core structures are not parallel to others. An aspect of some embodiments is a recognition that undesired patterns, or pattern defects, (such as the pattern of 10b) may be inadvertently induced during self-assembly of block copolymers if excessive energy, or internal stress, is present in a system during the self-assembly; and a recognition of methods for determining formulations of block copolymers that may reduce the internal stresses and defects present in self-assembled block copolymer systems.

Figure 4:
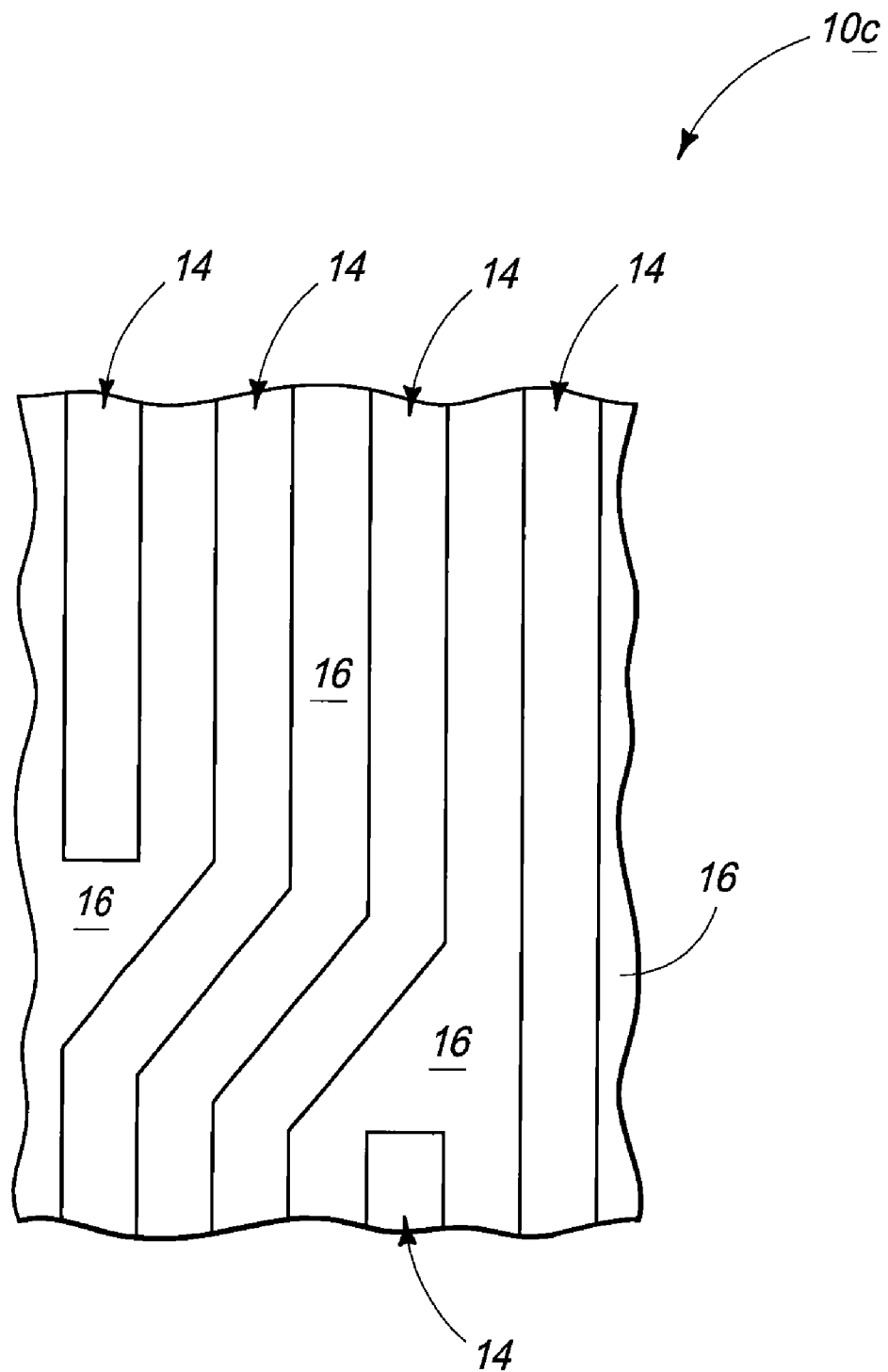
FIG. 4 is a diagrammatic cross-sectional top view of another construction comprising copolymer, and shows another non-desired pattern within the copolymer.

Construction 10b illustrates one of many configurations that may occur in which not all of the core structures formed by self-assembly of copolymers are parallel to one another. Another example configuration is shown in FIG. 4 as a construction 10c, which is also a pair of dislocation defects, separated by two periods of assembled structures. Other types of defects may form during assembly of energetically frustrated block copolymer systems. For example, disclinations may also form in monolayers of surface-parallel cylinders. When surface-normal cylinders or monolayers of spherical micellular structures are considered, additional defects, such as grain boundaries, may result with greater frequency when entropic chain stretching occurs in order to accommodate the geometric mismatch between the molecular (block) chain lengths and the shape of the final unit cell.

An aspect of some embodiments is a recognition that self-assembly of patterns from block copolymer may lead to a geometric mismatch that resembles a "round peg in a square hole". For example, in the cross-sectional view of a monolayer of a cylinder-forming block copolymer, the block copolymer may form round core structures within polygonal unit cells. Since the polygonal cells are of a different shape than the core structures contained therein, there are varying distances between the outer surfaces of the core structures (with the "outer surfaces" of the core structures being the locations of the interfaces of the core structures and the surrounding regions) and the inner surfaces of the unit cells. Thus, there is substantial heterogeneity, or distribution, amongst the distances that are to be covered by the blocks of the block copolymer molecules. In other examples, the geometric mismatch may reflect a "round peg in a hexagonal hole" when the cylindrical domains of a cylinder-forming block copolymer are oriented normal (perpendicular) to the substrate surface. When the minor block of a block copolymer composition forms micellular domains, the geometric mismatch may be envisioned as a sphere within a cubic or columnar hexagonal unit cell. An aspect of some embodiments is recognition that if there is not sufficient polydispersity amongst the chain lengths of the majority blocks of a block copolymer to span the range of distances that are to be covered by the assembled block copolymer, then residual internal stresses will be incorporated within the assembled block copolymer system. The residual internal stresses result from the combined effects of minimization of interfacial area and the associated entropic chain stretching that occurs to fill the volume of the unit cells. This reduction in conformational entropy increases the free energy of the assembled block copolymer system, which leads to an observed increase in the frequency of defects in self-assembled block copolymer patterns. A further aspect of some embodiments is a recognition of specific geometric relationships that may be used in formulating block copolymer molecules to have distributions of block chain lengths that are tailored to uniformly fill particular types of unit cells without excessive chain stretching, thereby minimizing the occurrence of pattern defects. An example of the geometric mismatches that may occur when block copolymer self-assembles into polygonal unit cells is described with reference to FIGS. 5-8.

Figure 5:
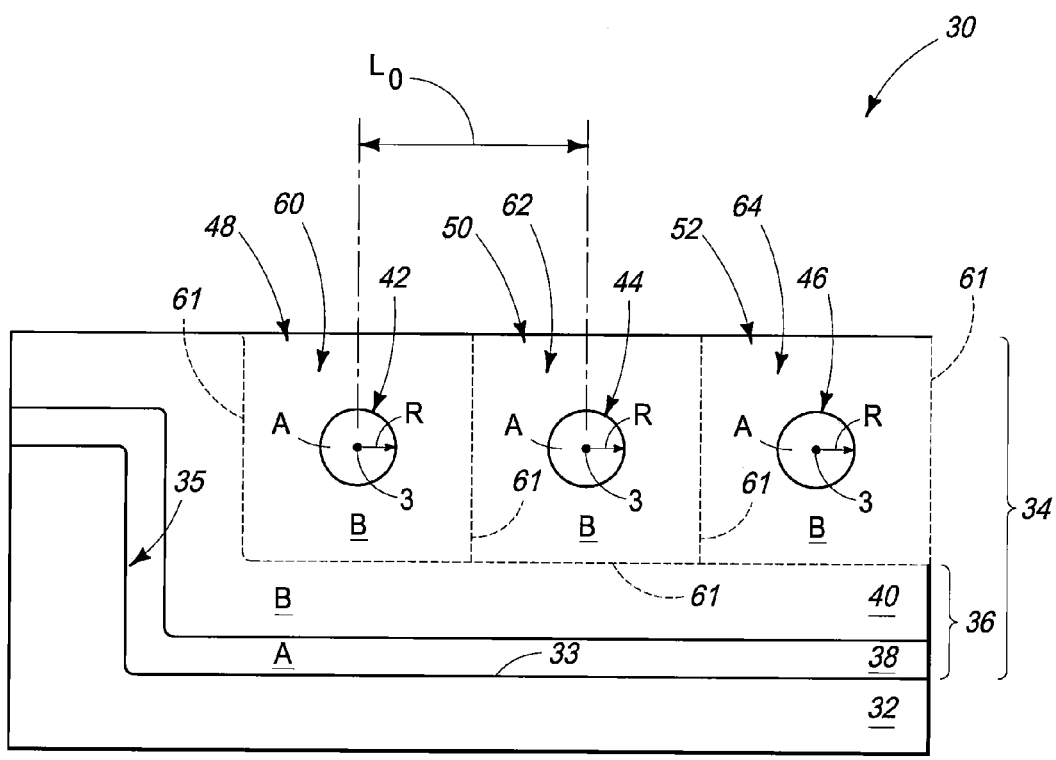
FIG. 5 is a diagrammatic cross-sectional side view of a construction comprising a pattern formed by self-assembly of a copolymer, and shows that part of the pattern may be considered to be arranged in unit cells.

Referring to FIG. 5, such shows a construction 30 comprising a base 32 having block copolymer 34 thereover. The block copolymer is a diblock copolymer containing the subunits A and B. The block copolymer has been provided over the base 32, and then subjected to conditions suitable to cause the block copolymer to self-assemble into a pattern over the base.

The base is shown having a horizontal surface 33, and a step 35 extending upwardly relative to such horizontal surface. The pattern formed from the block copolymer comprises a brush layer 36 that extends conformally along horizontal surface 33 and step 35; with such brush layer including a first portion 38 corresponding to the A subunit of the block copolymer, and a second portion 40 corresponding to the B subunit of the block copolymer. The block copolymer used to generate the pattern of FIG. 5 may initially have either the formula A-B or the formula B-A.

The self-assembled block copolymer over brush layer 36 comprises a plurality of core structures 42, 44 and 46 composed of subunit A. The core structures 42, 44 and 46 are over surface 33 of base 32, and may be linear structures that extend along a direction that is in and out of the page relative to the cross-section of FIG. 5. The core structures 42, 44 and 46 are analogous to the structures 14 of construction 10 in FIGS. 1 and 2, and to the structures 14 of construction 10a in FIG. 3.

The self-assembled block copolymer also comprises regions 48, 50 and 52 surrounding the core structures 42, 44 and 46, with such regions being composed of subunit B. The core structures 42, 44 and 46, together with the regions 48, 50 and 52 surrounding such core structures, form a repeating pattern across the horizontal surface 33 of base 32. Such repeating pattern comprises a unit cell that contains a core structure composed of subunit A and the region composed of subunit B that surrounds such core structure. For instance, the cross-sections of three unit cells 60, 62 and 64 are shown in FIG. 5, with boundaries of the unit cells being shown with dashed lines 61.

The illustrated core structures 42, 44 and 46 may correspond to cylindrical structures extending into and out of the page relative to the cross-section of FIG. 5, or to spherical micelles, and accordingly may have the shown circular cross-sections along the plane of the cross-section of FIG. 5. The circular cross-sections of structures 42, 44 and 46 are each shown to have a center 3, and to have a radius "R" extending from the center of the circular cross-section to the surface of the circular cross-section (with the "surface" of the circular cross-section being the interface of subunits A and B). In some embodiments, the core structures 42, 44 and 46 may have cross-sections that are shapes other than circular. Regardless, there will be a distance R that corresponds to an average distance from center locations of the cross-sections of the core structures to interface locations of the cross-sections of the core structures. The distance R may be generically referred to as an average center-to-interface distance across a cross-section extending through the core structures. In some embodiments, the core structures may be linear structures extending orthogonally relative to the cross-section of FIG. 5, and the distance R may thus be determined along a cross-section orthogonal to a primary linear direction of the core structures.

The core structures 42, 44 and 46 may be considered to correspond to a repeating pattern formed over base 32, with such repeating pattern having a center-to-center distance between adjacent core structures of $L_0$; where $L_0$ is considered to be a natural pitch of the repeating pattern. In some embodiments, the core structures 42, 44 and 46 may be ultimately utilized as a patterned mask during formation of integrated circuit structures within a semiconductor construction comprising base 32; and it may be desired that all of the core structures be substantially identical to one another, and that the repeating pattern have identical pitch across all of the core structures.

It is noted that unit cell 60 may be slightly different than unit cells 62 and 64 due to the unit cell 60 being along an edge of step 35. However, in the shown embodiment such difference does not alter the pitch between structure 42 and adjacent structure 44.

Figure 6:
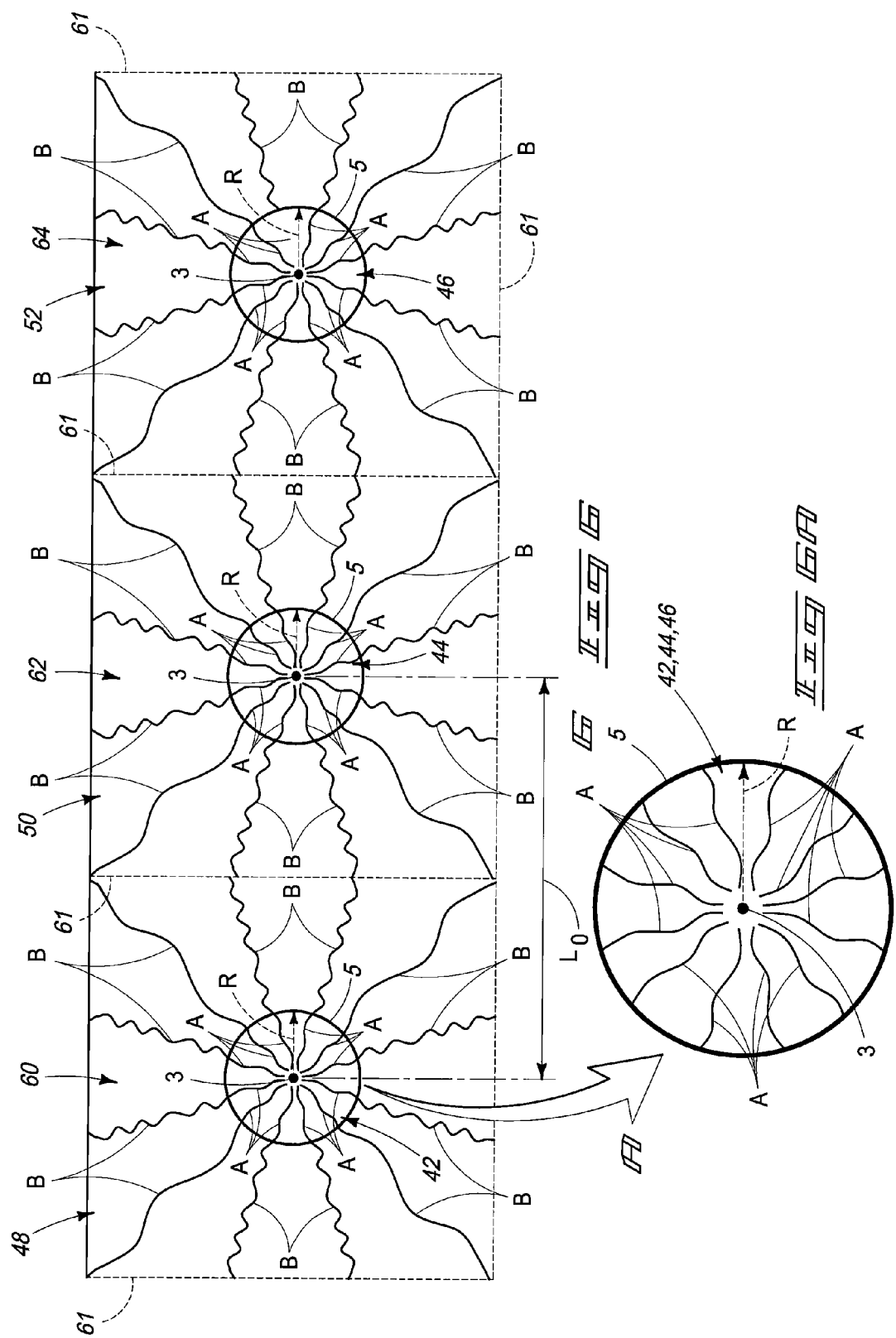
FIG. 6 is cross-sectional side view showing another diagrammatic representation of a region of the construction of FIG. 5.

FIG. 6 shows an alternative diagrammatic representation of the unit cells 60, 62 and 64 from FIG. 5. Specifically, some B subunit chains are shown extending throughout regions 48, 50 and 52 of the unit cells; and some A subunit chains are shown extending throughout the core structures 42, 44 and 46 of the unit cells. There are naturally many more molecular chains involved than are illustrated in FIG. 6. The core structures are shown to have interfaces 5, and to have the center-to-interface distances "R" that were discussed above with reference to FIG. 5. FIG. 6A shows an expanded region of FIG. 6 to assist the reader in visualizing the various features present within a core structure.

Figure 10:
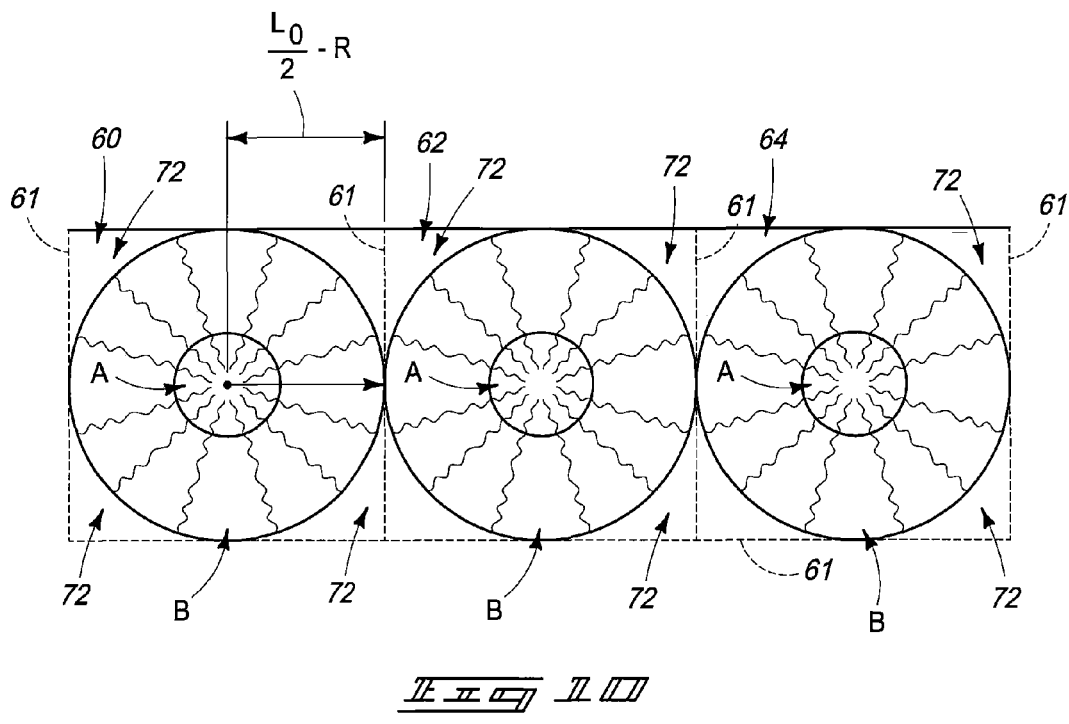
FIG. 10 is cross-sectional side view analogous to that of FIG. 6, and showing a fictional arrangement of self-assembled subunits A and B that helps to explain some embodiments.

FIG. 6 illustrates a problem that may result from having round core structures within polygonal unit cells. Specifically, the figure shows that the distance from an interface 5 of a core structure (for instance, core structure 42) to a corner of a polygonal unit cell (for instance, the corner of the square unit cell 60) is greater than the distance from the interface of the core structure to the side of the unit cell. Thus, the B subunit chains extend across a greater distance in regions where the B subunit chains extend from the interface of the core structure to the corners of the unit cell, relative to the regions where the B subunit chains extend from the interface of the core structure to the sidewalls of the unit cell. It may assist the reader's understanding of FIG. 6 to contrast FIG. 6 with the diagram shown in FIG. 10, (which is discussed below), which shows a representation of the unit cells of FIG. 6 under fictional conditions in which the B subunits do not stretch or contract from a relaxed orientation. The diagram of FIG. 10 is provided only to assist the reader's understanding of FIG. 6, and does not show an actual structure.

The lengthening of the distance covered by the B subunit chains in some regions of the unit cell relative to others, as shown in FIG. 6, may cause stretching of the chains in the regions where the chains are lengthened. The regions where the chains are lengthened may have B subunit chains stretched relative to a desired relaxed conformation. Alternatively, or additionally, regions where the B subunit chains have less room to stretch (specifically, the regions between the core structure interfaces and the unit cell sidewalls) may cause the B subunit chains to be compressed relative to the desired relaxed conformation. In any event, at least some of the B subunit chains are in a conformation other than the natural relaxed conformation of such chains, and this introduces stress into the system which may cause a self-assembled pattern to deviate from a desired orientation analogous to that described with reference to construction 10a of FIG. 3. As discussed above, the stress may increase free energy of the assembled system, due to competing effects of minimization of interfacial area and entropic chain stretching to fill additional volume. An elevated free energy per chain may be associated with an exponential increase in dislocation defect density, due to effective reduction in the potential barrier for defect formation.

The relaxed conformation of the B subunit will have a length $L_B$ based on, among other things, a degree of polymerization within the subunit and the statistical average segmental length of the monomer utilized in the polymerization to form the B subunit. The concept of "length" of given subunit of a copolymer may be subject to interpretation, in that the subunits may be fluctuating through many different conformations in any given environment. For instance, the "length" of a given subunit of a copolymer may be considered an average of several possible conformations that the subunit may adopt in a given environment, rather than being a value corresponding to a rigid conformation of the subunit. Alternatively, the length of the subunit may be based on a model of a rigid conformation of the subunit. For purposes of interpreting this document and the claims that follow, the "length" of a subunit may be determined by any suitable technique that would be chosen by a person of ordinary skill in the art.

Figure 7:
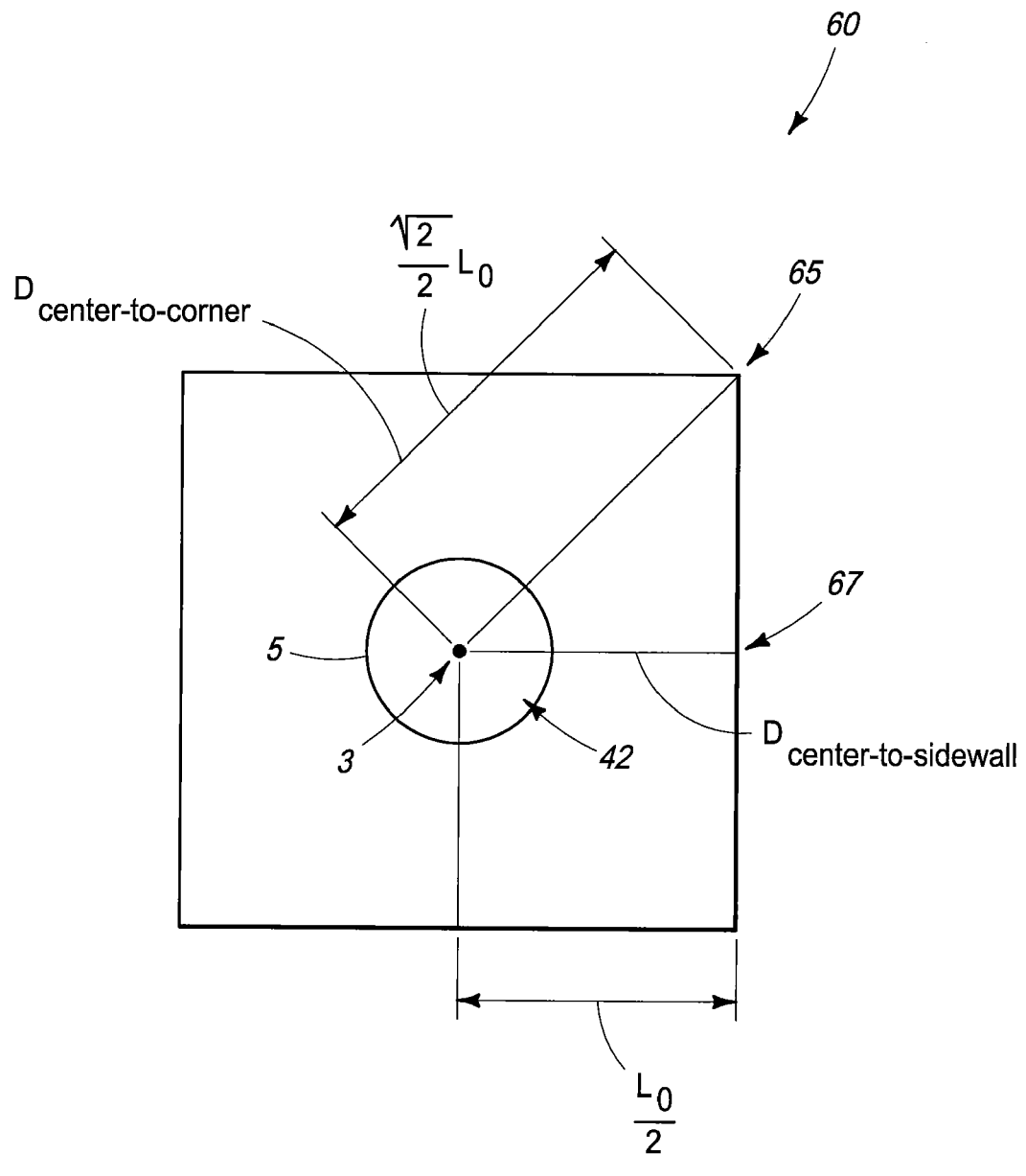
FIG. 7 is a diagrammatic representation of one of the unit cells of FIG. 5, and shows distances from a center of the unit cell to a side of the unit cell, and from the center of the unit cell to a corner of the unit cell.

FIG. 7 shows an alternative diagrammatic representation of the unit cell 60, and geometrically illustrates the different distances from a center 3 of the polygonal unit cell to a corner 65 of the unit cell, and to a sidewall 67 of the unit cell. The distance to the corner may be referred to as a distance $D_{center-to-corner}$, and the distance to the sidewall be referred to as a distance $D_{center-to-sidewall}$. The distances $D_{center-to-corner}$ and $D_{center-to-sidewall}$ may be calculated from the geometry of unit cell 60, and may be related to the center-to-center distance $L_0$ between adjacent core structures (for instance, the distance between the core structures 42 and 44 of FIG. 6). In the shown embodiment in which the unit cell is a square (in cross-sectional view), the distance $D_{center-to-corner}$ is $$\frac{\sqrt{2}}{2}L_0$$

and the distance $D_{center-to-sidewall}$ is $$\frac{L_0}{2}.$$

Figure 8:
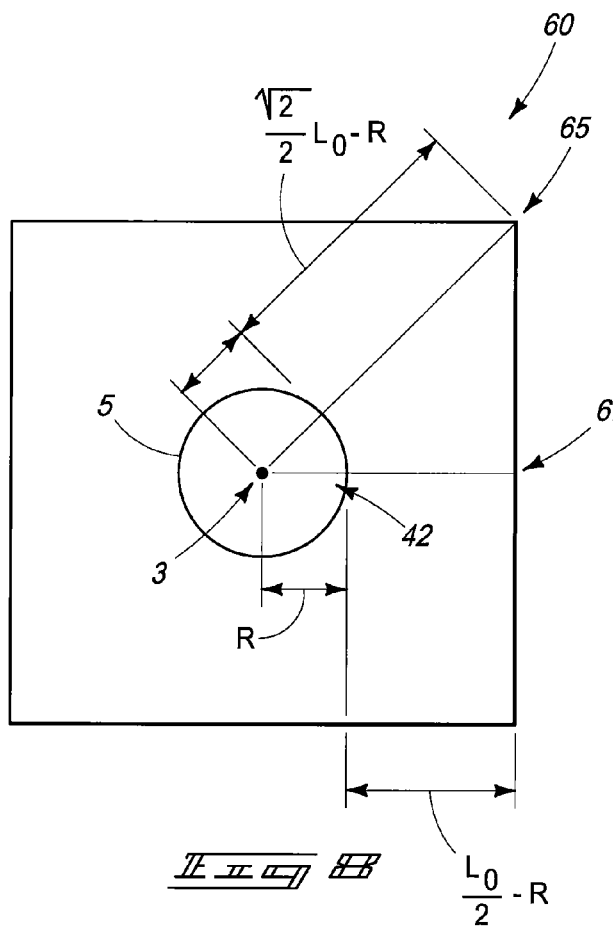
FIG. 8 is a diagrammatic representation of one of the unit cells of FIG. 5, and shows various geometric distances within the unit cell.

FIG. 8 shows a diagrammatic representation of the unit cell 60 similar to that of FIG. 7, and geometrically illustrates the different distances from an interface 5 of the core structure 42 to the corner 65 and sidewall 67 of the unit cell. The distance from center 3 to interface 5 corresponds to the distance "R" discussed above. Thus, the distance from the interface 5 to the corner 65 is ($D_{center-to-corner}$-R), and the distance from the interface 5 to the sidewall is ($D_{center-to-sidewall}$-R). Using the distances $D_{center-to-corner}$ and $D_{center-to-sidewall}$ discussed above with reference to FIG. 7, the distance from interface 5 to corner 65 is $$\left(\frac{\sqrt{2}}{2}L_0 - R\right)$$

and the distance from interface 5 to sidewall 67 is $$\left(\frac{L_0}{2} - R\right).$$

An aspect of some embodiments is recognition that it can be advantageous to prepare a block copolymer composition to have a distribution of B subunit lengths that is polydisperse across a range tailored to fill the various regions of a unit cell containing the self-assembled block copolymer (for instance, the unit cell 60 of FIGS. 5-8). Specifically, the B subunit lengths ($L_B$) within a block copolymer composition may be tailored to be distributed across a range defined by Equation 1.

$$[D_{center-to-sidewall})-R] \leq L_B \leq [(D_{center-to-corner})-R]$$ Equation 1

The various parameters of Equation 1 were discussed above with reference to FIGS. 7 and 8. In the particular embodiment of FIGS. 5-8, the various distances in Equation 1 may be calculated, as described above with reference to FIGS. 7 and 8, to ascertain the Equation 2 specific for structures that have, along at least one cross-section, round core structures in square unit cells.

$$\left(\frac{L_0}{2} - R\right) \leq L_B \leq \left(\frac{\sqrt{2}}{2}L_0 - R\right)$$ Equation 2

The lengths $L_B$ within a composition may be determined with any suitable technique. In some embodiments, the lengths are determined by ascertaining the molecular formulas of the B subunits, and then calculating the lengths based on a rigid model of the B subunits. In other embodiments, the lengths of the B subunits are determined by ascertaining the molecular formulas of the B subunits and then calculating the lengths based on a model that considers statistical variations in the conformations of the B subunits. In yet other embodiments, the lengths of the B subunits may be directly measured with one or more analytical tools.

Figure 9:
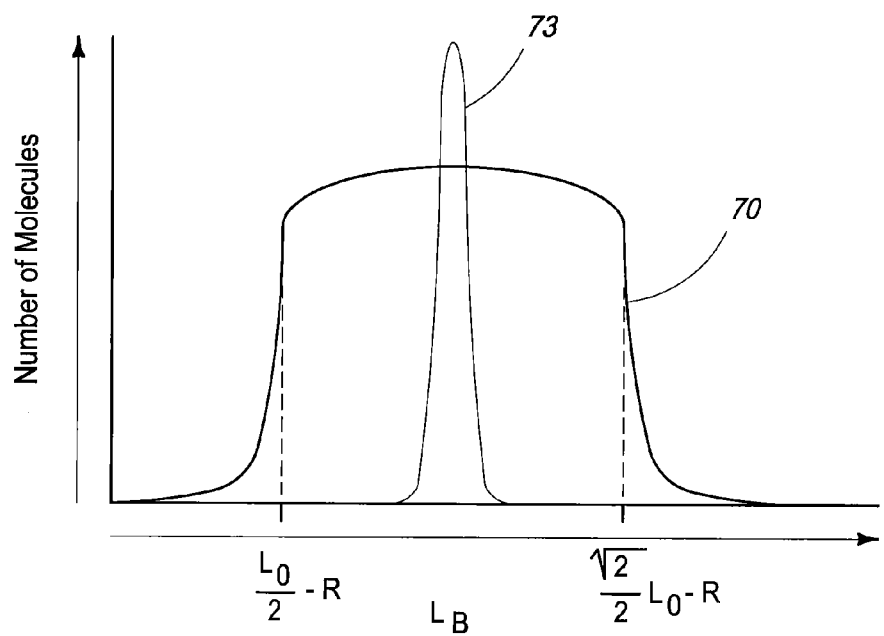
FIG. 9 is a graphical illustration of an example distribution of lengths of one of the subunits of a block copolymer (with such lengths corresponding to $L_B$) in accordance with an embodiment; and compares such example embodiment to a diagrammatic representation of a prior art distribution. The axes of the graph correspond to the number of molecules (vertical axis), and the lengths of the B subunits ($L_B$), (horizontal axis).

FIG. 9 graphically illustrates a distribution of $L_B$ across the range of Equation 2 as a curve 70. Specifically, the curve 70 in FIG. 9 represents a population of diblock copolymer molecules having length $L_B$ of the B block distributed across the range of Equation 2. The y-axis value of any point on curve 70 corresponds to the number of molecules within a population of block copolymer molecules that have the length of the B block corresponding to the x-axis value ($L_B$) at that point. Thus, each y-value may be thought of as a "count" representative of the quantity of molecules in a distribution having a given length.

Although the y-value is chosen to be the number of molecules having a given length, the y-value could alternatively correspond to any parameter that reflects a proportion of a population having a given length, such as a volume fraction, weight fraction, number fraction, etc. Similarly, although the x-value is chosen to be length, the x-value could alternatively correspond to any parameter related to length, such as, for example, degree of polymerization, molecular weight, etc. Regardless of the parameter chosen for the y-axis, the concept that each y-value may be thought of as a "count" representative of the quantity of molecules in a distribution having a given length will remain true.

In some embodiments, the population distribution shown by curve 70 in FIG. 9 may be considered to be diagrammatically representative of a population of diblock copolymers that would be used to minimize the geometric mismatch, and defect occurrence, in a monolayer of assembled surface-parallel cylinders in a cylinder-forming block copolymer system.

Although curve 70 is illustrated as a continuous function in FIG. 9, in practice, the distribution of block lengths is discretized by the minimum increment of block length, which is related to the size of the individual monomer units.

The embodiment represented by curve 70 of FIG. 9 shows most of the B blocks of the diblock copolymer molecules having a length $L_B$ within the range between $$\left(\frac{L_0}{2} - R\right) \text{ and } \left(\frac{\sqrt{2}}{2}L_0 - R\right).$$

However, there is some tailing of the population into the region shorter than $$\left(\frac{L_0}{2} - R\right),$$

and also some tailing of the population into the region longer than $$\left(\frac{\sqrt{2}}{2}L_0 - R\right).$$

Such tailings of the population may result from practical limitations of attempting to form a distribution of the B subunit lengths across the desired range.

In some embodiments, the cumulative sum, or "count", of the number of molecules with B-block chain lengths that are outside of the desired range is small compared to the total number of molecules within the system. In other words, the number (count) of molecules with B-block chain lengths outside of the desired range comprises a small fraction of the overall population of block copolymer molecules. Alternatively, the number (count) of molecules with B-block chain lengths within the desired range comprises a large fraction of the overall population of block copolymer molecules. In some embodiments, the percentage of block copolymer molecules within a given population that have the B subunit lengths within the desired range will be greater than 50 percent of the population so that the lengths $L_B$ of such population are "predominantly" within the desired range. In some embodiments, the percentage of block copolymer molecules within a given population that have the B subunit lengths within the desired range will be greater than 90 percent of the population so that the lengths $L_B$ of such population are "substantially entirely" within the desired range. In some embodiments, the tailings shown in FIG. 9 are eliminated and the percentage of block copolymer molecules within a given population of block copolymer molecules that have the B subunit lengths within the desired range will be 100 percent of the population so that the lengths $L_B$ of such population are "entirely" within the desired range.

A curve 73 is provided in FIG. 9 to diagrammatically represent a prior art distribution of lengths $L_B$ for comparison to the embodiment represented by curve 70. The distribution represented by curve 73 is a narrow (low polydispersity) distribution of B-block chain length. The distribution represented by curve 73 is not sufficient to alleviate the chain stretching due to the geometric mismatch, because the curve 73 distribution does not provide the appropriate allocation of chain lengths to fill the unit cell in a manner where all of the B subunit chains can have a relaxed configuration.

The distribution represented by curve 70 of FIG. 9 is one of numerous distributions that may be utilized in various embodiments, and generally any suitable distribution may be used that extends across all, or at least a substantial portion of, the range of Equation 2. In some embodiments, the distributions may be continuous (such as the shown curve 70), or discontinuous (as shown and discussed below with reference to FIG. 14). In some embodiments, continuous distributions may correspond to "normal" (i.e., Gaussian) distributions, and in other embodiments the continuous distributions may not be Gaussian distributions. The embodiment shown by curve 70 of FIG. 9 comprises a distribution that is symmetric across the range of Equation 2. In other embodiments, the distribution may not be symmetric across the range.

The distribution represented by curve 70 of FIG. 9 may be distinguished from the prior art distribution represented by curve 73 in that curve 70 has fairly constant y-values across the entirety of the range of Equation 2, and curve 73 does not. As discussed above, each y-value may be considered to be a "count" representative of the quantity of molecules in a distribution having a given B subunit length. In some embodiments, a diblock copolymer composition will be provided to have a distribution of lengths $L_B$ across the range of Equation 2 that is uniform to the extent that the "count" of molecules per each of the individual lengths across the range will all be within a factor of $10^6$ of one another (with a first value being within a "factor of $10^6$" of a second value if the first value is no less than one-millionth of the second value, and no more than one million times the second value). In particular applications, the diblock copolymer composition may be provided to have a distribution of lengths $L_B$ across the range of Equation 2 that is uniform to the extent that the count of molecules per each of the individual lengths $L_B$ across the range are all within a factor of $10^5$ of one another, all within a factor of $10^4$ of one another, all within a factor of $10^3$ of one another, all within a factor of $10^2$ of one another, all within a factor of 10 of one another, or even all the same, or about the same, as one another (which is the case illustrated with curve 70 in FIG. 9).

The graph of FIG. 9 shows a curve 70 representing a continuous distribution of lengths across the range of Equation 2, or, in other words, shows that there is a non-zero count (i.e., a y-value greater than 0 in the graph of FIG. 9) for every obtainable length $L_B$ across the range of Equation 2 (as discussed previously, $L_B$ is discretized into integer numbers of monomers, and thus lengths that would require monomer fragments are not obtainable). In some embodiments, the distribution across the range of Equation 2 may be discontinuous (see, for example, FIG. 14, which is discussed below) so that not all of the obtainable lengths $L_B$ are present in the distribution.

In the embodiments in which the distribution across the range of Equation 2 is discontinuous, some of the counts (i.e., y-values in the graphs of the types shown in FIGS. 9 and 14) for obtainable lengths $L_B$ will be zero. In such embodiments, the diblock copolymer composition does not have the count of molecules per each of the individual obtainable lengths $L_B$ across the range of Equation 2 all within a given factor of one another. However, such embodiments can still be distinguished from the prior art in that a significant fraction of the range of Equation 2 will be encompassed by fairly constant counts. In some embodiments, the diblock copolymer composition may be provided to have a discontinuous distribution of lengths $L_B$ across the range of Equation 2, and yet the distribution across the range of Equation 2 is uniform to the extent that at least 50% of the counts corresponding to the number of molecules per each of the individual lengths $L_B$ across the range are all within a given factor of one another, at least 60% of such counts are all within a given factor of one another, at least 70% of such counts are all within a given factor of one another, at least 80% of such counts are all within a given factor of one another, or at least 90% of such counts are all within a given factor of one another.

In some embodiments, it can be desired that the distribution of $L_B$ across the range of Equation 2 be appropriate to fill the unit cell (for instance, the unit cell 60 of FIG. 8) without requiring chain stretching and imposing stresses on the block copolymer molecules within a population. Such can allow maximization of conformal chain entropy, and hence a reduction in the free energy of an assembled block copolymer system relative to prior art systems. The reduction in free energy may enable access to a lowest possible equilibrium dislocation concentration, which may enable problems analogous to those shown in constructions 10b of FIGS. 3 and 10c of FIG. 4 to be avoided.

An aspect of some embodiments is an understanding that there is an advantage to utilizing a block copolymer composition having a polydisperse distribution of subunit lengths within the ranges of the types set forth by Equations 1 and 2, rather than having a tight distribution of subunit lengths. It may assist the reader in understanding the invention to compare the geometrical arrangement of assembled block copolymer of FIG. 6 to a fictional arrangement in which the assembled block copolymer molecules have maintained their relaxed chain conformation without stretching to completely fill the volume of the unit cells. FIG. 10 shows such fictional arrangement of assembled copolymer relative to the unit cells 60, 62 and 64 that were discussed above with reference to FIG. 6. In the arrangement of FIG. 10, the B subunits form cylinders around the core structures comprising the A subunits, and empty spaces 72 are within corners of the unit cells adjacent the cylinders formed from the B subunits. In reality, empty spaces 72 do not actually form. Instead, the B subunits stretch to fill the entirety of the unit cell as shown in FIG. 6 (due to, for example, interfacial tension and a thermodynamic drive to minimize interfacial area). If the arrangement of FIG. 10 actually formed, then there would be an advantage to having a tight distribution of the B subunit lengths. Specifically, the B subunits lengths in FIG. 10 are all the same; and are a distance shown as $$\left(\frac{L_0}{2} - R\right).$$

However, since the actual arrangement of assembled copolymer is more analogous to the situation of illustrated in FIG. 6 than to the situation of FIG. 10, it is desirable to have a large amount of polydispersity across the B subunit lengths so that the B subunits can span the different geometrical distances of a unit cell without imposing stresses and strain within the assembled block copolymer system.

Figure 11:
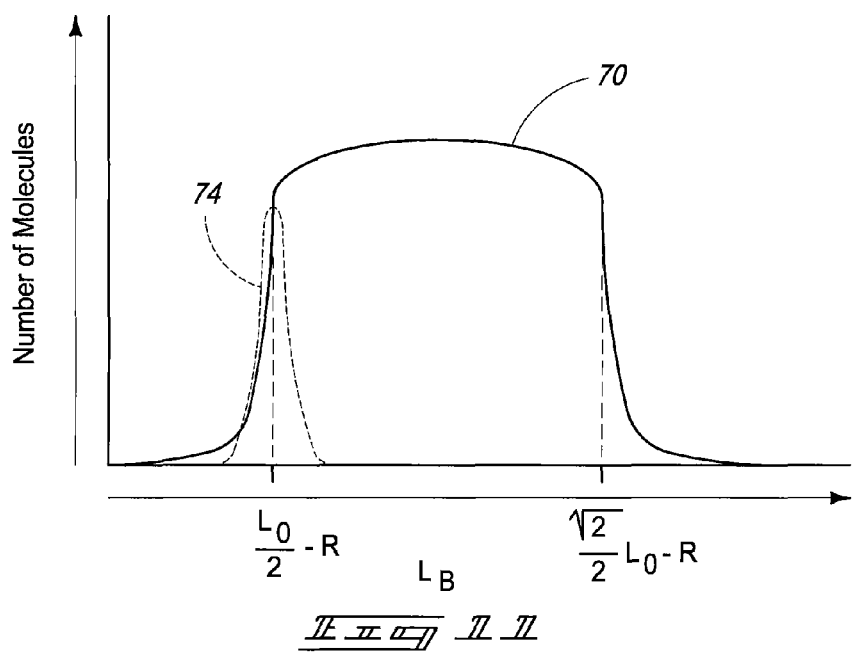
FIG. 11 is a graphical illustration similar to that of FIG. 9, and comparing an example embodiment distribution of subunit lengths in a copolymer composition with a diagrammatic representation of a prior art distribution of subunit lengths in a copolymer composition (with the representation of the prior art distribution being shown in dashed line).

FIG. 11 compares a tight distribution of B subunit lengths ($L_B$) about the length corresponding to $$\left(\frac{L_0}{2} - R\right)$$

(with the tight distribution being shown as a curve 74 in dashed line) to the distribution of the example embodiment discussed above with reference to FIG. 9 (shown as the curve 70). The tight distribution of curve 74 has similar problems to those discussed above regarding the distribution illustrated as curve 73 of FIG. 9.

Curves 73 of FIGS. 9 and 74 of FIG. 11 are provided for illustrative purposes only, and are not intended to be generally representative of all of the prior art. Some prior art processes may form distributions of subunit lengths that are in other locations than those of curves 73 of FIGS. 9 and 74 of FIG. 11. Also, the unit $L_0$ may be altered by the nature of the block copolymer composition, so that different block copolymer compositions will assemble into structures having different pitches relative to one another. Thus, the $L_0$ of an assembly obtained using block copolymer having a prior art distribution of subunit lengths may be different than that obtained using block copolymer having a distribution of subunit lengths corresponding to an embodiment of the present invention. However, the concepts shown in FIGS. 9 and 11 that the prior art distributions of subunit lengths are different than the distributions obtained with the various embodiments of the present invention, are accurate.

The graph of FIG. 11 shows the prior art distribution (curve 74) at one end of the distribution of Equation 2 (curve 70). Thus, the shown prior art distribution has a different median value than does the distribution of Equation 2. In practice, it may be desired that the distribution of Equation 2 have the same median value as the prior art distribution of curve 74, but be a wider distribution than the prior art distribution of curve 74. Also, in practice the distribution obtained using Equation 2 may have a different value of $L_0$ than the prior art distribution of curve 74; so the comparison of the curves in FIG. 11 may be inaccurate in that such comparison assumes a same value of $L_0$ for both the prior art distribution of curve 74 and the Equation 2 distribution of curve 70. In some embodiments, curve 70 may be configured to have a value of $L_0$ that is different from that of prior art curve 74, and that enables curve 70 to have a common median value as the prior art curve while encompassing a broader distribution.

Although the block copolymers described in FIGS. 5-11 are diblock copolymers, the invention also includes embodiments utilizing triblock copolymers and other multi-block copolymers that contain more than two basic subunits, or blends thereof. The concepts of FIGS. 5-11 do not change when using multi-block copolymers containing more than two basic subunits. Specifically, there will still be a desired distribution of subunit lengths required to fill the unit cell volume with minimum chain stretch or compression with respect to the chain equilibrium length. Also, such desired distribution may be geometrically calculated using calculations analogous to those discussed above with reference to Equations 1 and 2. For instance, a triblock copolymer having the formula A-B-C will still have a desired distribution of lengths for the various subunits A, B and C; and such desired distributions may be geometrically calculated using concepts analogous to those described with reference to FIGS. 7 and 8.

A block copolymer composition having a desired distribution of subunit lengths may be formed by any suitable method. In some embodiments, the synthesis of a subunit utilized within a block copolymer composition may comprise conditions which vary the degree of polymerization within such subunit to create a desired distribution of subunit lengths. For instance, the synthesis of the B subunit of an A-B block copolymer (or a B-A block copolymer) may comprise conditions which vary the degree of polymerization within the B subunits to create the distribution of $L_B$ within the range described above in Equation 2. In specific examples, the diblock copolymer polystyrene-b-poly (2-vinylpyridine) may be considered to comprise B subunits corresponding to polystyrene in some embodiments, and to comprise B subunits corresponding to poly (2-vinylpyridine) in other embodiments. If the polystyrene corresponds to the B subunits, the polystyrene may be synthesized under conditions in which varying degrees of polymerization create the distribution within $L_B$ of Equation 2 within the block copolymer; and if the poly (2-vinylpyridine) corresponds to the B subunits, the poly (2-vinylpyridine) may be synthesized under conditions in which varying degrees of polymerization create the distribution within $L_B$ of Equation 2 within the block copolymer.

Figure 12:
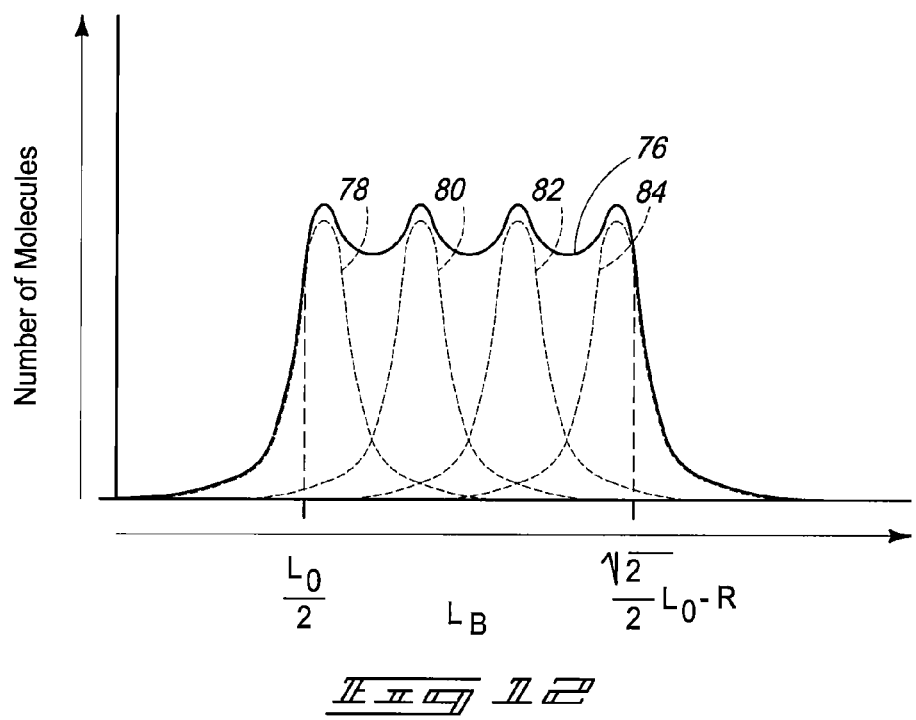
FIG. 12 is a graphical illustration similar to that of FIG. 9, and shows how the distribution of FIG. 9 may be generated from a blend of different copolymers.
Figure 13:
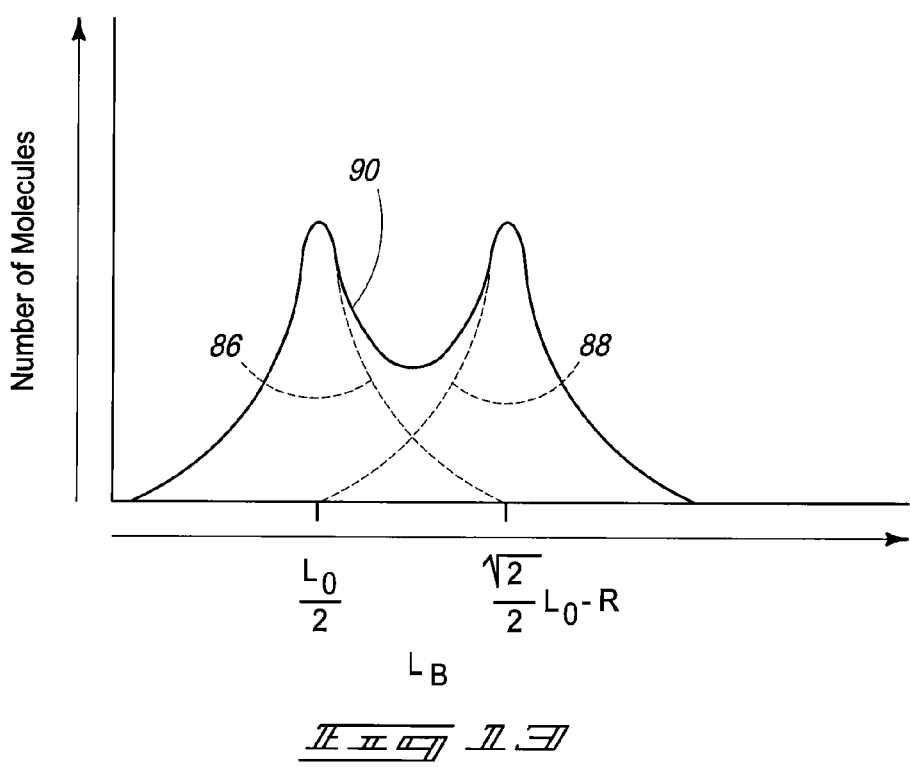
FIG. 13 is a graphical illustration similar to that of FIG. 9, and shows another example of how a distribution of lengths of a B subunit of a copolymer ($L_B$) may be generated from a blend of different copolymers.
Figure 14:
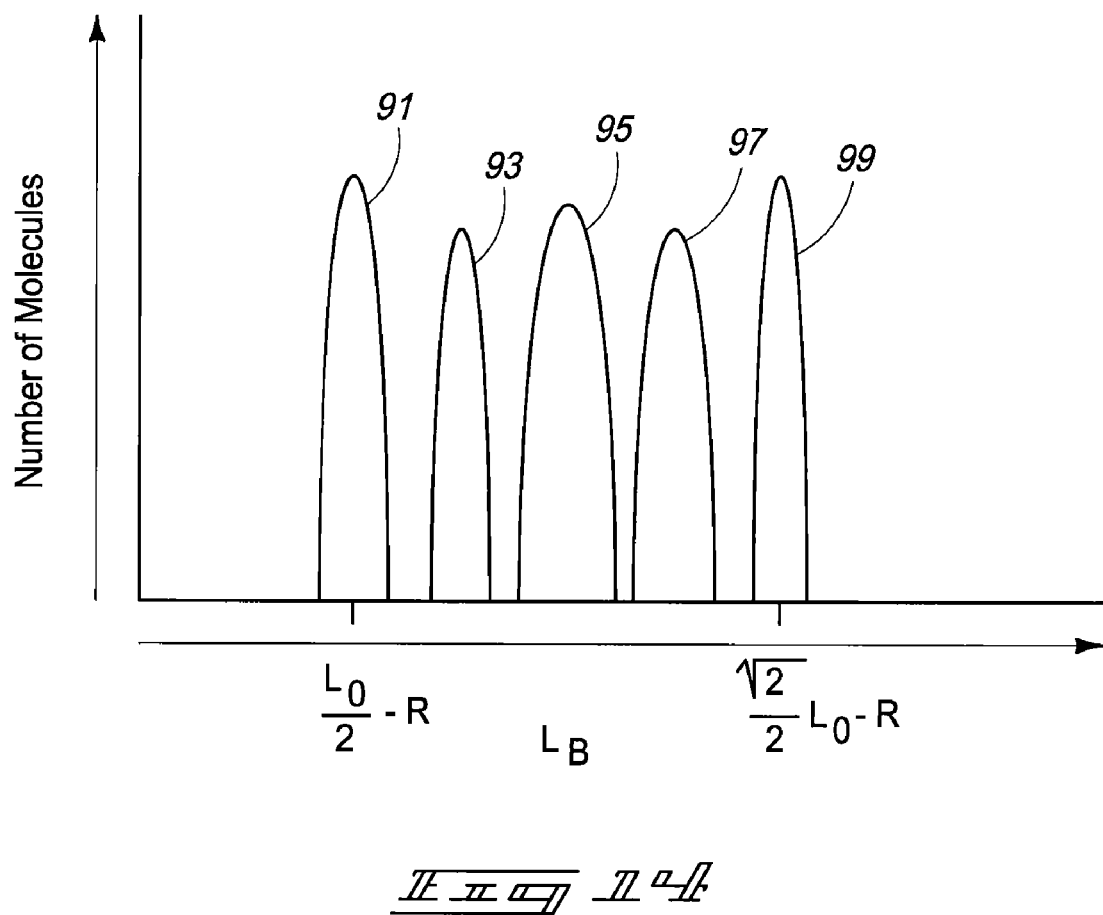
FIG. 14 is a graphical illustration similar to that of FIG. 9, and shows another example of how a distribution of lengths of a B subunit of a copolymer ($L_B$) may be generated from a blend of different copolymers.

Another method for formulating a block copolymer composition to have a desired distribution of subunit lengths is to create the block copolymer composition as a blend of two or more compositions that individually have distributions of $L_B$ within sub-portions of a desired range of $L_B$. FIGS. 12-14 graphically illustrate some example embodiment methods for creating a final block copolymer composition as a blend of two or more individual block copolymer compositions.

Referring to FIG. 12, a desired distribution of $L_B$ within a final block copolymer composition is shown by the curve 76; and a plurality, n, of individual block copolymer compositions are shown to each have distributions of $L_{B,i}$ within ranges corresponding to curves 78, 80, 82 and 84 (shown in dashed lines). The individual block copolymer compositions are mixed with one another to form the final block copolymer composition having the distribution of $L_B$ of curve 76

$$\left(\text{i.e., } L_B = \sum_{i=1}^{n} L_{B,i}\right).$$

The individual block copolymer compositions have distributions of $L_{B,i}$ across complementary regions of a desired range of $L_B$ corresponding to the range of Equation 2, and thus the entire range of $L_B$ of Equation 2 can be covered with the mixture of the individual compositions.

Although the individual block copolymer compositions of FIG. 12 are shown to have distributions that are similar to one another in size and shape, in other embodiments the individual block copolymer compositions may have distributions that vary in one or both of size and shape relative to the graph of FIG. 12. If the individual block copolymer distributions differ from one another, they may differ in an amount of a main component (i.e., a height on the y-axis of FIG. 12), and/or in the level of polydispersity (i.e., a width on the x-axis of FIG. 12), and/or in type (i.e., the overall shape of the distribution, which may be, for example, symmetric, asymmetric, Gaussian, etc.). In some embodiments, two or more narrow, prior art-type distributions may be combined with ratios appropriate to form the final block copolymer composition having the desired distribution of $L_B$.

The method shown in FIG. 12 creates a very uniform cumulative distribution $L_B$ across the desired range of Equation 2 by combining multiple individual block copolymer compositions. In other embodiments, the number of individual block copolymer compositions may be varied relative to the number shown in FIG. 12 to create either a more uniform distribution (by using more individual block copolymer compositions) or a less uniform distribution (by using fewer individual block copolymer compositions). An advantage of a more uniform distribution of $L_B$ across a desired range is that energy within an assembled copolymer system may be minimized, but a disadvantage may be that additional time and materials are required to create the cumulative distribution. In contrast, an advantage of a less uniform distribution of $L_B$ across a desired range is that the distribution may be created with little additional time and materials, but the disadvantage may be that increased internal stresses within the assembled copolymer system leads to the formation of a greater concentration of defects analogous to those of constructions 10b and 10c (FIGS. 3 and 4). In some embodiments, it may be desired to find an appropriate blend which minimizes defects analogous to those of constructions 10b and 10c (FIGS. 3 and 4) to an acceptable concentration, while also avoiding mixing more than a minimum number of individual block copolymer compositions.

FIG. 13 graphically illustrates a method similar to that discussed above with reference to FIG. 12, but in which a final copolymer composition represented by curve 90 is formed by mixing only two individual copolymer compositions that are represented by curves 86 and 88 (shown in dashed lines). The final copolymer composition of FIG. 13 is less uniform across the desired range of Equation 2 than the final copolymer composition of FIG. 12, but in some embodiments the final copolymer composition of FIG. 13 may be adequately uniform to avoid undesired defects in a copolymer assembly (such as, for example, defects analogous to those described above with reference to constructions 10b and 10c of FIGS. 3 and 4).

The distributions of FIGS. 9 and 11-13 are represented as continuous across the range of Equation 2, without illustrating the natural discretization that occurs due to a finite length of each additional monomer unit (in other words, the distributions of FIGS. 9 and 11-13 are continuous to the extent that every obtainable length $L_B$ is represented). In other embodiments, distributions across such range may be discontinuous such that every obtainable length $L_B$ across the range is not represented. For instance, FIG. 14 shows a cumulative distribution that comprises five separate individual distributions (labeled as curves 91, 93, 95, 97 and 99) within the range between $$\left(\frac{L_0}{2} - R\right) \text{ and } \left(\frac{\sqrt{2}}{2}L_0 - R\right).$$

The various individual distributions may be referred to as separate components of the cumulative distribution, and thus the cumulative distribution of FIG. 14 may be considered to be achieved as a penta-component assortment of individual distributions. The individual distributions may be each roughly the same size and shape as one another, or may differ in size and/or shape relative to one another. If the individual distributions differ from one another, they may differ in an amount of a main component (i.e., a height on the Y-axis of FIG. 14), and/or in the level of polydispersity (i.e., a width on the X-axis of FIG. 14), and/or in type (i.e., the overall shape of the distribution, which may be, for example, symmetric, asymmetric, Gaussian, etc.). Any suitable number of individual distributions may be utilized. The trade-offs involved in choosing the number of individual distributions to utilize will be similar to those discussed above with reference to FIGS. 12 and 13.

In some embodiments, it is recognized that there may be advantages to having a distribution of the subunit A lengths, in addition to, or alternatively to, having the distribution of subunit B lengths. Specifically, it is recognized that a low polydispersity of A-block chain lengths will require significant chain stretching/compression to uniformly fill a cylindrical or spherical core of minor domain features in assembled block copolymer systems. Thus, it may be desired that the lengths $L_A$ of the A subunits be distributed across a range such that a significant percentage of the A subunits have a length $L_A$ that is less than R. The length $L_A$ refers to a length of an equilibrium conformation of the A subunit, as opposed to a conformation that is stressed by a surrounding environment to induce stretching or contraction of the A subunit.

In some embodiments, the A subunits may be distributed across a range described in Equation 3, where "$L_{min}$" is a length less than R.

$$L_{min} \leq L_A \leq R \qquad \text{Equation 3}$$

The length $L_{min}$ may be any suitable length, and in some embodiments may be described as a fraction of R. For instance, in some embodiments, $L_{min}$ may be 0.1R, 0.2R, 0.3R, etc.

Figure 15:
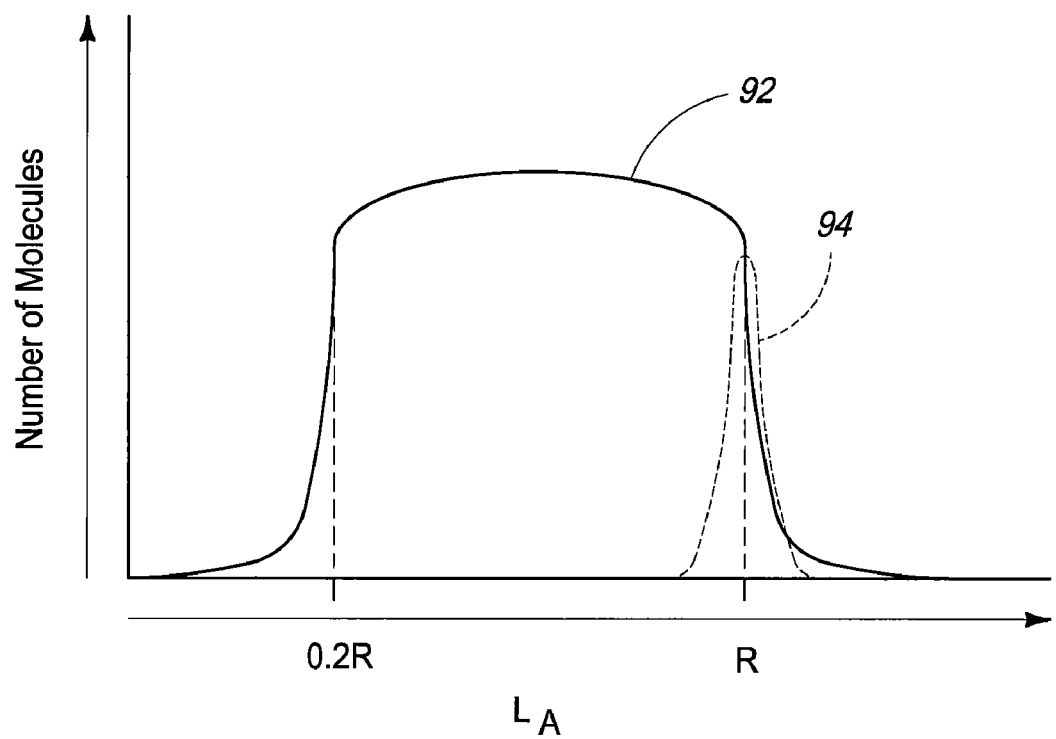
FIG. 15 is a graphical illustration of an example distribution of lengths of an A subunit of a block copolymer (with such lengths corresponding to $L_A$) in accordance with an embodiment. The axes of the graph correspond to the number of molecules (vertical axis), and the lengths of the A subunits ($L_A$), (horizontal axis).

FIG. 15 shows a curve 92 that graphically illustrates a substantially uniform distribution of A subunit lengths ($L_A$), that spans the range of Equation 3, and in which $L_{min}$ is 0.2R. The y-axis value of any point on curve 92 corresponds to the number, or concentration, of molecules within a population of block copolymer molecules that have a length of the A-block that corresponds to the x-axis value ($L_A$) at that point. Alternatively, such distributions of chain lengths within a block copolymer population may be expressed on the y-axis in terms of the number fraction, weight fraction, and or volume fraction of the molecules having a corresponding $L_A$ on the x-axis. Although the shown x-axis value is $L_A$, the x-axis values may correspond to any suitable parameters related to $L_A$, such as, for example, the degree of polymerization, the number average molecular weight, the mass average molecular weight, etc.

The embodiment of FIG. 15 shows most of the diblock copolymer molecules of the population having a length $L_A$ within the range between 0.2R and R. However, there is some tailing of the population into the region shorter than 0.2R, and also some tailing of the population into the region longer than R, for reasons similar to those discussed above with reference to FIG. 9 in describing the tailing regions of FIG. 9.

The distribution of $L_A$ across the range of Equation 3 may be "uniform" in a sense similar to that discussed above with reference to FIG. 9 regarding the distribution $L_B$. For instance, in some embodiments a diblock copolymer composition may be provided to have a distribution of lengths $L_A$ across the range of Equation 3 that is uniform to the extent that the "count" of molecules per each of the individual lengths across the range will all be within a factor of $10^6$ of one another, all within a factor of $10^5$ of one another, all within a factor of $10^4$ of one another, all within a factor of $10^3$ of one another, all within a factor of $10^2$ of one another, all within a factor of 10 of one another, or even all the same, or about the same, as one another.

Although the curve 92 of the graph of FIG. 15 is continuous across the range of Equation 3 (more specifically, is continuous to the extent that every obtainable length $L_A$ is represented, and ignores discretization due to the utilization of only integer numbers of the A blocks), it is to be understood that in other embodiments the distribution across the range of Equation 3 may be discontinuous (i.e., not every obtainable length $L_A$ will be represented, analogously to the discontinuous distribution of $L_B$ discussed above with reference to FIG. 14). In some embodiments, the diblock copolymer composition may be provided to have a discontinuous distribution of lengths $L_A$ across the range of Equation 3, and yet the distribution across the range of Equation 3 is uniform (analogously to the discussion above with reference to FIG. 9 regarding the lengths $L_B$) to the extent that at least 50% of the counts corresponding to the number of molecules per each of the individual lengths $L_A$ across the range are all within a given factor of one another, at least 60% of such counts are all within a given factor of one another, at least 70% of such counts are all within a given factor of one another, at least 80% of such counts are all within a given factor of one another, or at least 90% of such counts are all within a given factor of one another.

FIG. 15 also shows an idealized distribution of A subunit lengths ($L_A$) of a prior art process that formed a tight distribution about the length corresponding to R (with the prior art distribution being shown as a curve 94 in dashed line). The distribution of the example embodiment (shown as curve 92) is a much broader distribution than the prior art distribution (shown as curve 94). Prior art efforts for "improving" block copolymer compositions may be directed toward tightening the distribution of subunit lengths; which is opposite to the approach described with reference to Equation 3 of creating a broad distribution of subunit lengths.

The relationships of Equations 1-3 may be used to develop a diblock composition which will assemble into the configuration of FIG. 5 with few, if any, defects. In some embodiments, the self-assembled structures (for instance, the core structures 42, 44 and 46; and/or surrounding regions 48, 50 and 52) may be used as a mask during subsequent processing of the underlying base 32 of FIG. 5. Such subsequent processing may include, for example, one or both of etching into base 32 and of implanting of dopant into base 32. For instance, the mask may be used in processing of the type described below with reference to FIGS. 31-34. In other embodiments, the block copolymer domains may form active electronic components within electronic devices like integrated circuits, sensors, optoelectronic, photonic or nanofluidic devices. Alternatively, the block copolymer domains may contain active elements, such as nanoparticles, quantum dots, or nanowires, which have been selectively incorporated within one, the other, or both domains. In yet other embodiments, the block copolymer domains may contain functional precursors, e.g. catalyst species, from which active elements are grown, or on which active elements are deposited.

Figure 16:
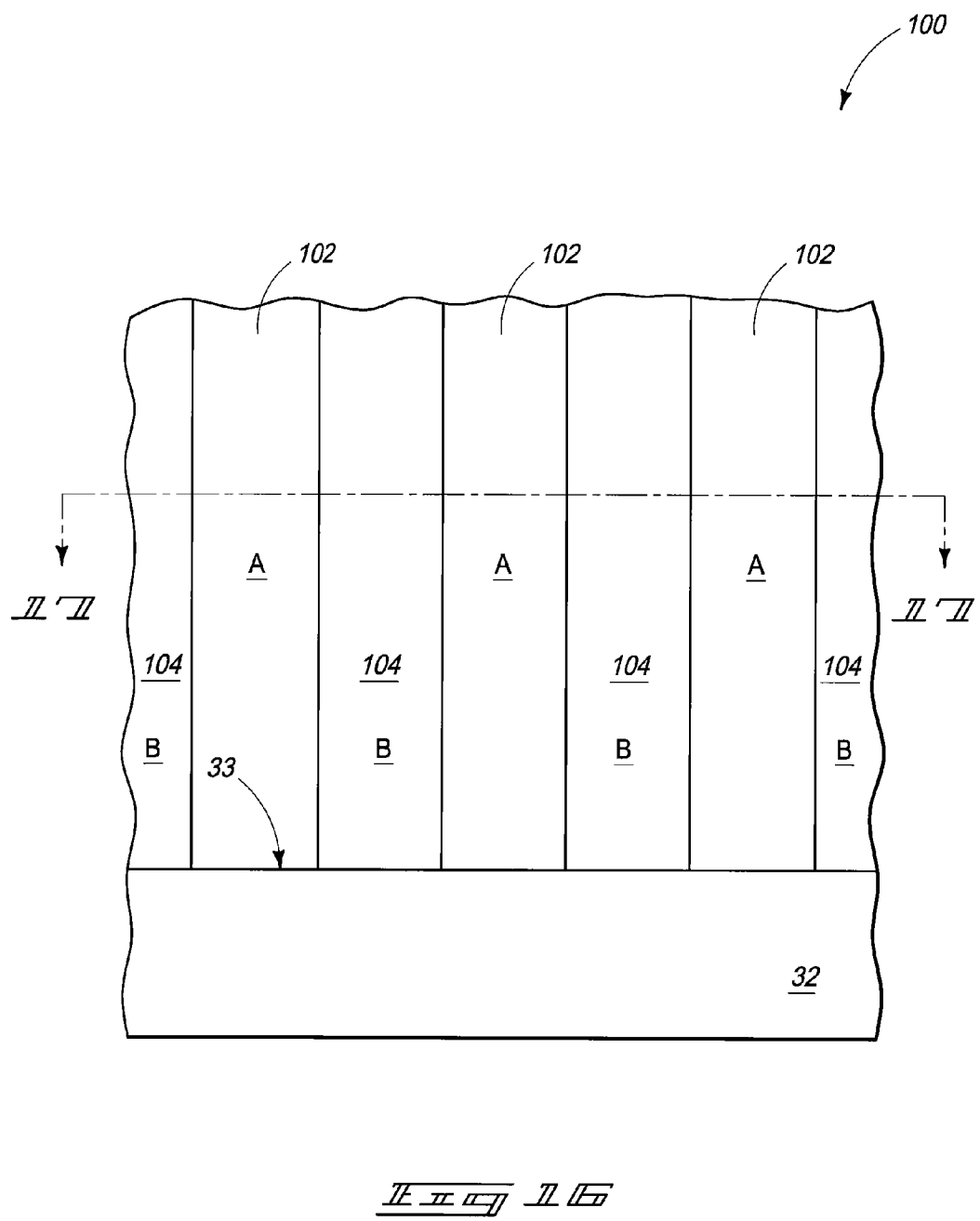
FIG. 16 is a diagrammatic cross-sectional side view of a construction comprising a pattern formed by self-assembly of a copolymer.
Figure 17:
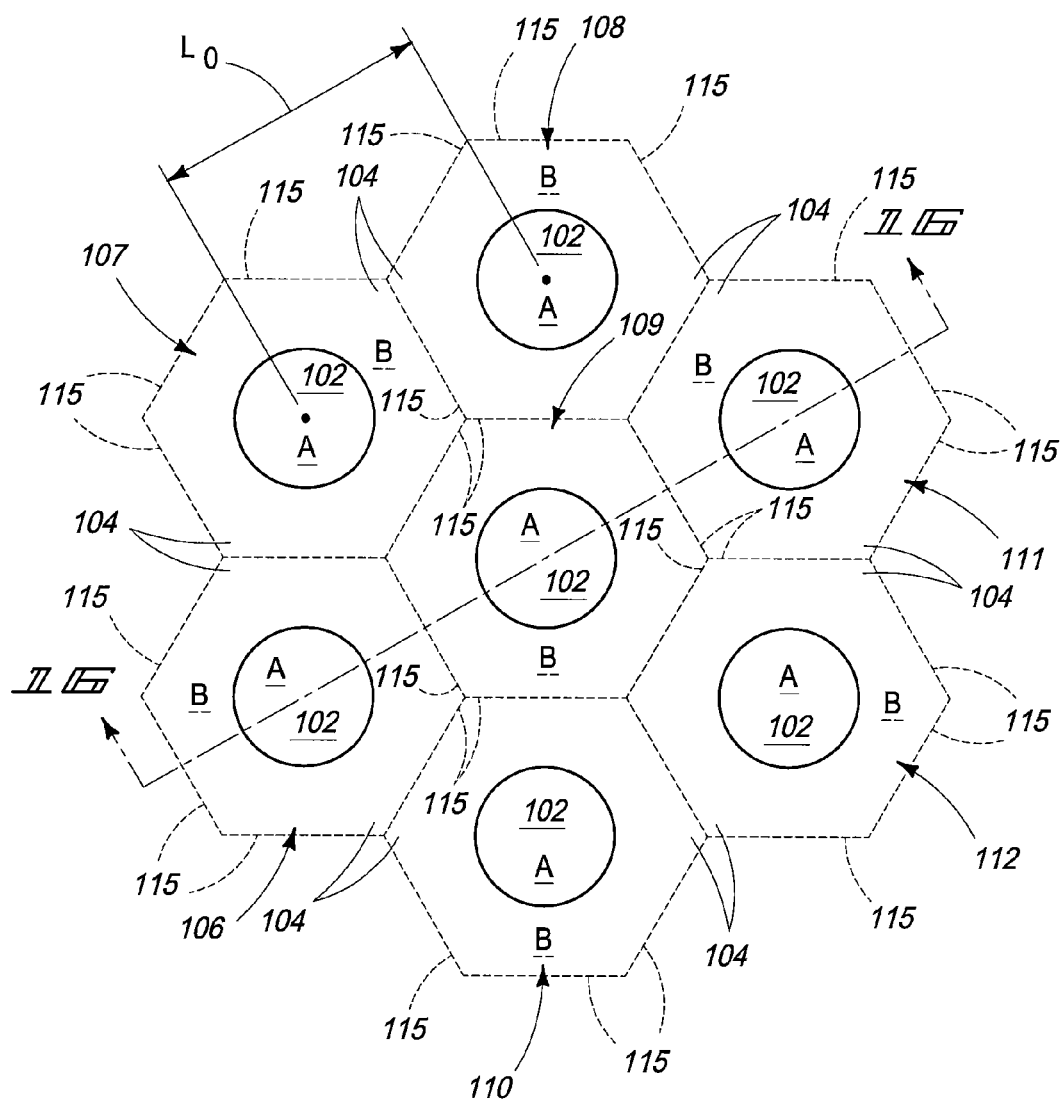
FIG. 17 is cross-sectional top view showing another diagrammatic representation of a region of the construction of FIG. 16, and shows that the pattern formed by self-assembly of the copolymer may be considered to be arranged in unit cells. The view of FIG. 17 is along the line 17-17 of FIG. 16, and the view of FIG. 16 is along the line 16-16 of FIG. 17.

The various methods described herein may be utilized for any geometry of unit cells, and may be used relative to linear structures and/or micelle structures (for instance, spherical micelles in cubic unit cells, or in hexagonal columnar unit cells). FIGS. 16 and 17 diagrammatically illustrate a semiconductor construction 100 in which block copolymer has assembled to form linear structures (specifically, cylinders) extending normal (i.e., perpendicular) to an upper surface 33 of an underlying base 32. Base 32 may correspond to a semiconductor substrate, and may have any of the compositions discussed above with reference to the base 32 of FIG. 5.

The assembled subunits form core structures 102 corresponding to A subunits, surrounded by regions 104 corresponding to B subunits. The core structures and surrounding regions together form a repeating pattern based upon a hexagonal unit cell (with the unit cells being shown in FIG. 17 as cells 106-112, and with boundaries between the unit cells being shown as dashed lines 115).

Figure 18:
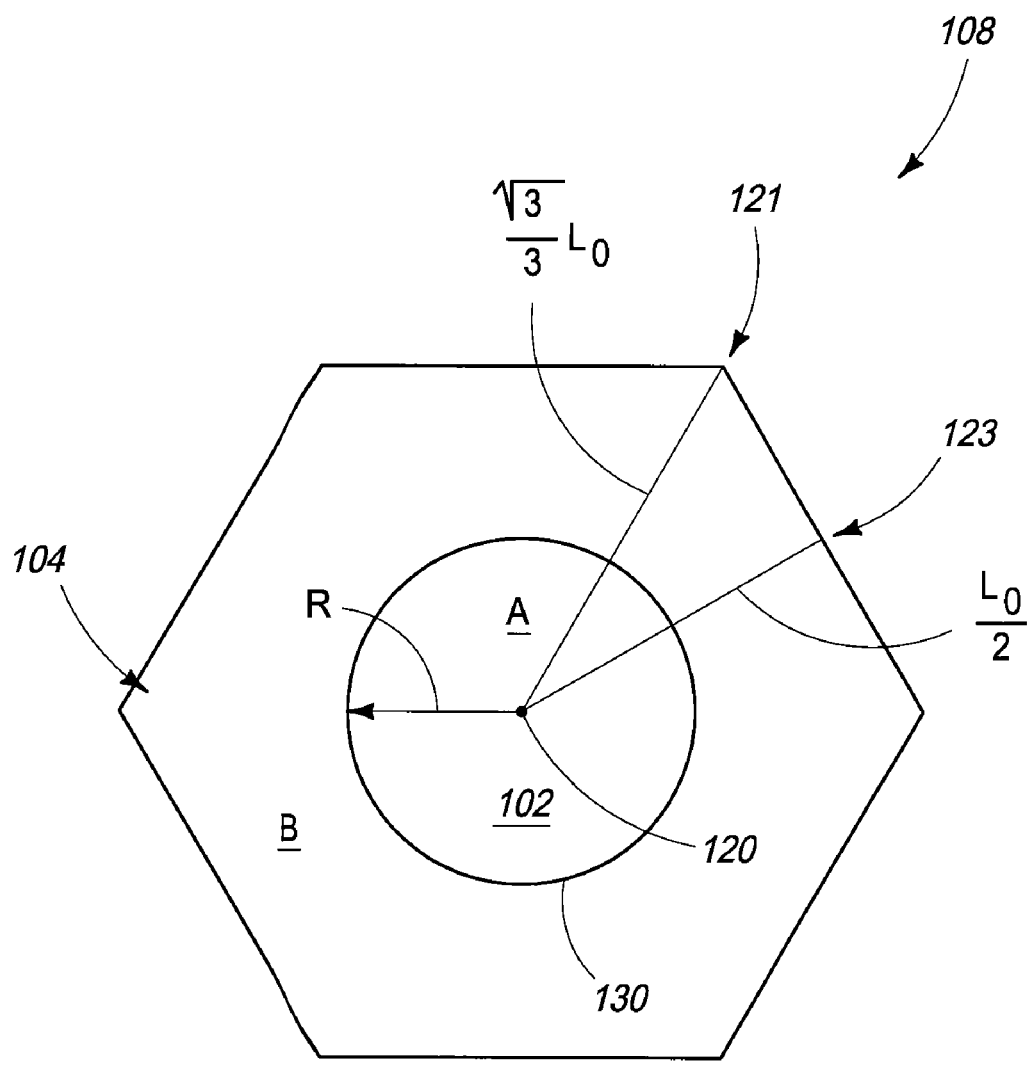
FIG. 18 is a diagrammatic representation of one of the unit cells of FIG. 17, and shows distances from a center of the unit cell to a side of the unit cell, and from the center of the unit cell to a corner of the unit cell.

FIG. 18 shows a diagrammatic representation of the unit cell 108, and geometrically illustrates the different distances from a center 120 of the polygonal unit cell to a corner 121 of the unit cell, and to a sidewall 123 of the unit cell. The distance to the corner corresponds to a distance $D_{center-to-corner}$, and the distance to the sidewall corresponds to a distance $D_{center-to-sidewall}$. The distances $D_{center-to-corner}$ and $D_{center-to-sidewall}$ may be calculated from the geometry of unit cell 108 (similar to the calculations discussed above with reference to FIG. 7), and may be related to a center-to-center distance $L_0$ between adjacent core structures (shown in FIG. 17). In the shown embodiment in which the unit cell is a hexagon, the distance $D_{center-to-corner}$ is $$\frac{\sqrt{3}}{3}L_0$$

and the distance $D_{center-to-sidewall}$ is $$\frac{L_0}{2}.$$

FIG. 18 also geometrically illustrates the different distances from an interface 130 of the core structure 102 (specifically an interface between A and B subunits that defines an outer edge of the core) to the corner 121 and sidewall 123 of the unit cell. The distance from center 120 to interface 130 corresponds to the distance "R" corresponding to an average radius of the core structure. Thus, the distance from the interface 130 to the corner 121 is ($D_{center-to-corner}-R$), and the distance from the interface 130 to the sidewall is ($D_{center-to-sidewall}-R$). Using the distances $D_{center-to-corner}$ and $D_{center-to-sidewall}$ discussed above, the distance from interface 130 to corner 121 is $$\left(\frac{\sqrt{3}}{3}L_0 - R\right)$$

and the distance from interface 130 to sidewall 123 is $$\left(\frac{L_0}{2} - R\right).$$

In the particular embodiment of FIG. 18, the distances analogous to those in Equation 1 may be calculated to ascertain Equation 4, which is specific for cylinders assembled within columnar hexagonal unit cells.

$$\left(\frac{L_0}{2} - R\right) \leq L_B \leq \left(\frac{\sqrt{3}}{3}L_0 - R\right) \quad \text{Equation 4}$$

Figure 19:
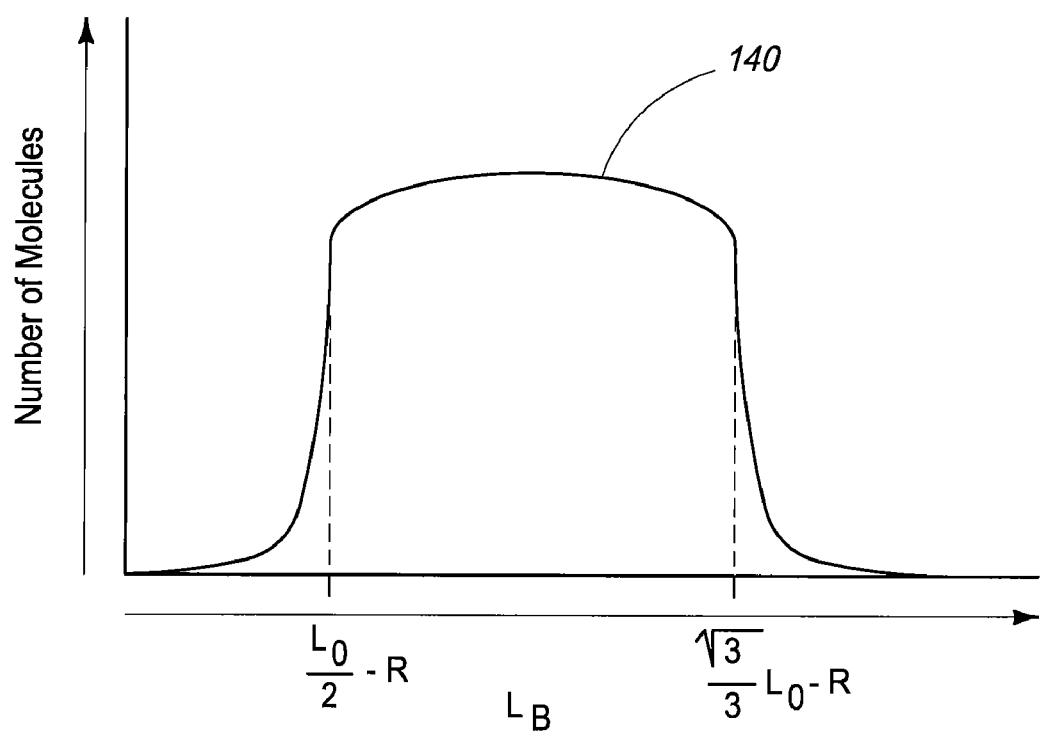
FIG. 19 is a graphical illustration of an example distribution of lengths of a subunit of a block copolymer (with such lengths corresponding to $L_B$) in accordance with an embodiment. The axes of the graph correspond to the number of molecules (vertical axis), and the lengths of the B subunits ($L_B$), (horizontal axis).

FIG. 19 graphically illustrates a curve 140 that represents a population of diblock copolymer molecules having length $L_B$ of the B-block distributed across the range of Equation 4. The y-axis value of any point on curve 140 corresponds to the number of molecules within a population of block copolymer molecules that have a length of the B block that corresponds to the x-axis value ($L_B$) at that point. Although the y-value is chosen to be the number of molecules having a given length, the y-value could alternatively correspond to any parameter that reflects a proportion of a population having a given length, such as a volume fraction, weight fraction, number fraction, etc. Similarly, although the x-value is chosen to be length, the x-value could alternatively correspond to any parameter related to length, such as, for example, degree of polymerization, molecular weight, etc.

The embodiment of FIG. 19 shows most of the diblock copolymer molecules of the population represented by curve 140 as having a length $L_B$ within a range that extends from $$\left(\frac{L_0}{2} - R\right) \text{ to } \left(\frac{\sqrt{3}}{3}L_0 - R\right).$$

However, there is some tailing of the population into the region shorter than $$\left(\frac{L_0}{2} - R\right),$$

and also some tailing of the population into the region longer than $$\left(\frac{\sqrt{3}}{3}L_0 - R\right),$$

for reasons similar to those discussed above with reference to FIG. 9 in describing the tailing regions of the curve 70 of FIG. 9. The curve 140 of FIG. 19 represents an example distribution, and other distributions (for instance, distributions analogous to those of FIGS. 12-14) may be formed in other embodiments.

The relationship of Equation 4 may be used to develop a diblock composition which will assemble into the configuration of FIGS. 16 and 17 with few, if any, defects. The self-assembled structures (for instance, one or both of the core structures 102 and surrounding regions 104) may be used as a mask during subsequent processing of underlying base 32 (FIG. 16). Such subsequent processing may include, for example, one or both of etching into base 32 and of implanting of dopant into base 32. For instance, the mask may be used in processing of the type described below with reference to FIGS. 31-34. In other embodiments, the block copolymer domains may form active electronic components within electronic devices like integrated circuits, sensors, optoelectronic, photonic, or nanofluidic devices. Alternatively, the block copolymer domains may contain active elements, such as nanoparticles, quantum dots, or nanowires, which have been selectively incorporated within one, the other, or both domains. In yet other embodiments, the block copolymer domains may contain functional precursors, e.g. catalyst species, from which active elements are grown, or on which active elements are deposited.

In some embodiments, relationships similar to those discussed above with reference to FIG. 15 may be used to define a distribution of lengths $L_A$ of the A subunits in the core structures 102.

The distribution of Equation 4 may be formed with any of the methods discussed above for forming the various distributions of Equations 1-3. In some embodiments, the B subunit lengths $L_B$ may be uniform to the extent that the count of molecules per each of the individual lengths across the range of Equation 4 will all be within a factor of $10^6$ of one another, all within a factor of $10^5$ of one another, all within a factor of $10^4$ of one another, all within a factor of $10^3$ of one another, all within a factor of $10^2$ of one another, all within a factor of 10 of one another, or even all the same, or about the same, as one another.

Although the curve 140 of the graph of FIG. 19 is continuous across the range of Equation 4 (more specifically, is continuous to the extent that every obtainable length $L_B$ is represented, and ignores discretization due to the utilization of only integer numbers of the B blocks), it is to be understood that in other embodiments the distribution across the range of Equation 4 may be discontinuous (i.e., not every obtainable length $L_B$ will be represented, analogously to the discontinuous distribution discussed above with reference to FIG. 14). In some embodiments, the diblock copolymer composition may be provided to have a discontinuous distribution of lengths $L_B$ across the range of Equation 4, and yet the distribution across the range of Equation 4 is uniform (analogously to the discussion above with reference to FIG. 9) to the extent that at least 50% of the counts corresponding to the number of molecules per each of the individual lengths $L_B$ across the range are all within a given factor of one another, at least 60% of such counts are all within a given factor of one another, at least 70% of such counts are all within a given factor of one another, at least 80% of such counts are all within a given factor of one another, or at least 90% of such counts are all within a given factor of one another.

Equations 1-4 are derived relative to planar cross-sections through unit cells, and thus are derived from geometrical relationships determined across only two dimensions of a unit cell. Such equations may be appropriate in applications in which the unit cells are linear sheets or strands extending across an underlying substrate. In some embodiments, however, block copolymer may assemble into unit cells for which it may be more appropriate to consider all three of the dimensions of the unit cells in determining optimal subunit length distributions for the block copolymer. For instance, some block copolymers may assemble into unit cells having spherical cores (which may correspond to micelles) contained within cubic unit cells.

Figure 20:
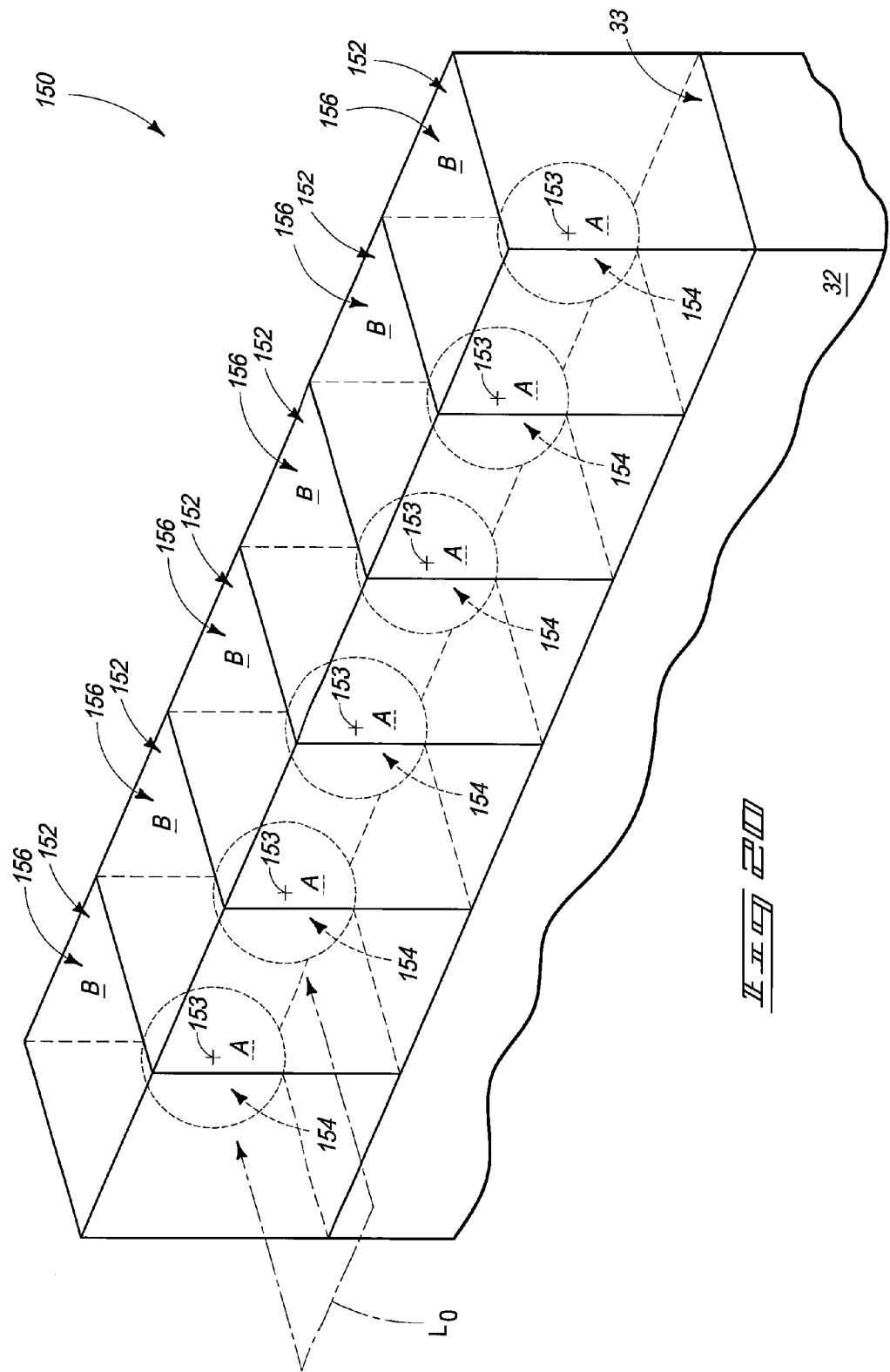
FIG. 20 is a three-dimensional view showing a diagrammatic representation of a construction comprising a pattern formed by self-assembly of a copolymer, and showing that the pattern may be considered to be arranged in unit cells. The centers of the various unit cells are diagrammatically illustrated with crosses to assist the reader in distinguishing the individual unit cells.

FIG. 20 shows a construction 150 in which block copolymer has self-assembled to form cubic unit cells 152 over an upper surface 33 of an underlying base 32. Base 32 may correspond to a semiconductor substrate, and may have any of the compositions discussed above with reference to the base 32 of FIG. 5. The unit cells have a center-to-center distance of $L_0$.

The self-assembled subunits of the block copolymer are shown to form core structures 154 corresponding to A subunits, surrounded by regions 156 corresponding to B subunits. The core structures and surrounding regions together form a repeating pattern of the cubic unit cells 152. Centers 153 of the unit cells are diagrammatically illustrated with crosses.

Figure 21:
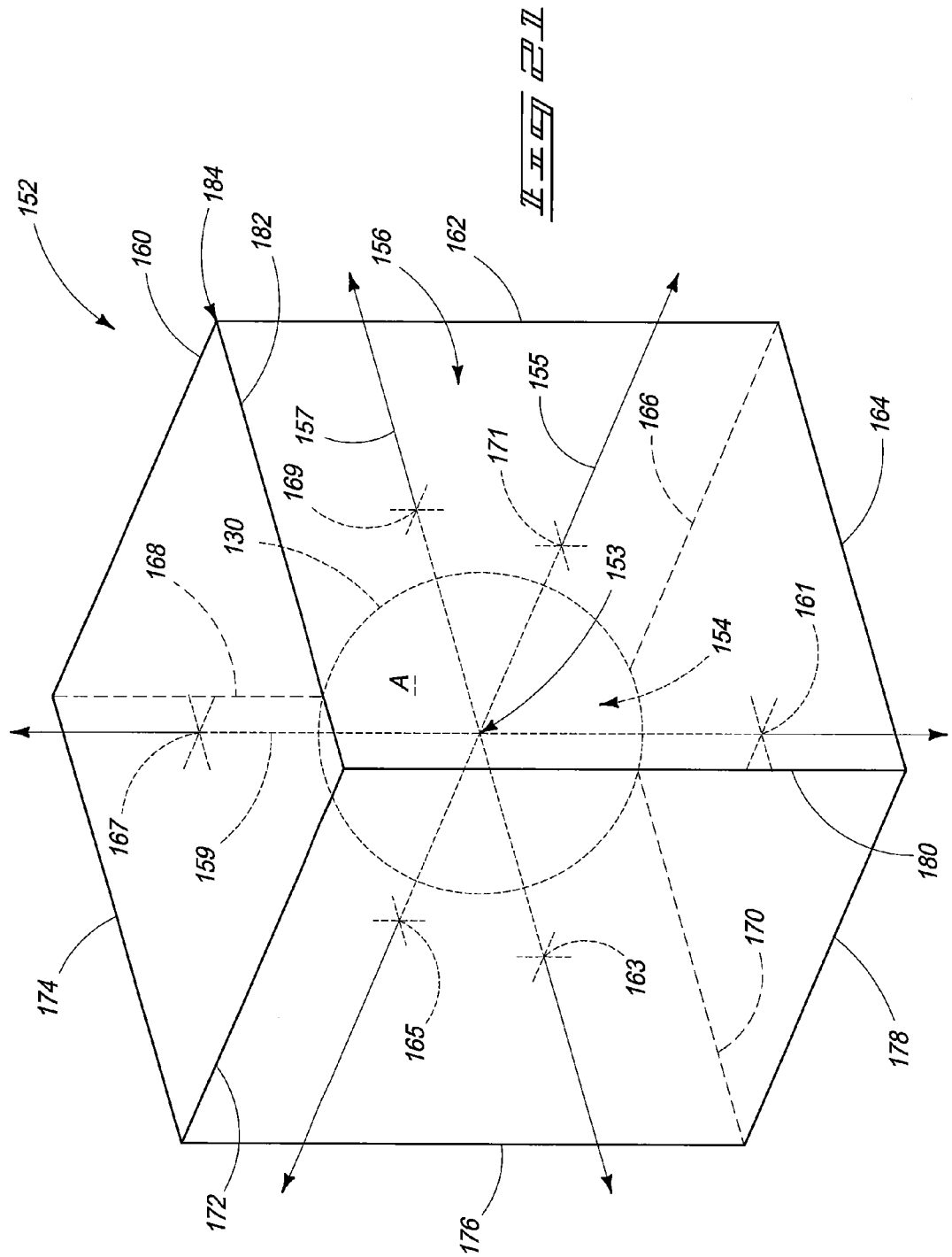
FIG. 21 is a three-dimensional view of one of the unit cells of FIG. 20. Three orthogonal axes are shown in FIG. 21, and crosses are provided at locations where the axes cross surfaces of the unit cell. The orthogonal axes and crosses are provided to assist the reader in visualizing the unit cell.

FIG. 21 shows a diagrammatic representation of one of the unit cells 152, and shows three orthogonal axes 155, 157 and 159 to assist the reader in visualizing the unit cell. The unit cell has edges 160, 162, 164, 166, 168, 170, 172, 174, 176, 178, 180 and 182; has corners where various of the edges meet with one another (for instance, the corner 184 where the edges 160, 162 and 182 meet), and has surfaces bounded by the edges. Locations where the axes cross the various surfaces of the unit cell are diagrammatically illustrated with the crosses 161, 163, 165, 167, 169 and 171. An interface 130 defines an outer surface of the spherical core structure 154.

Figure 22:
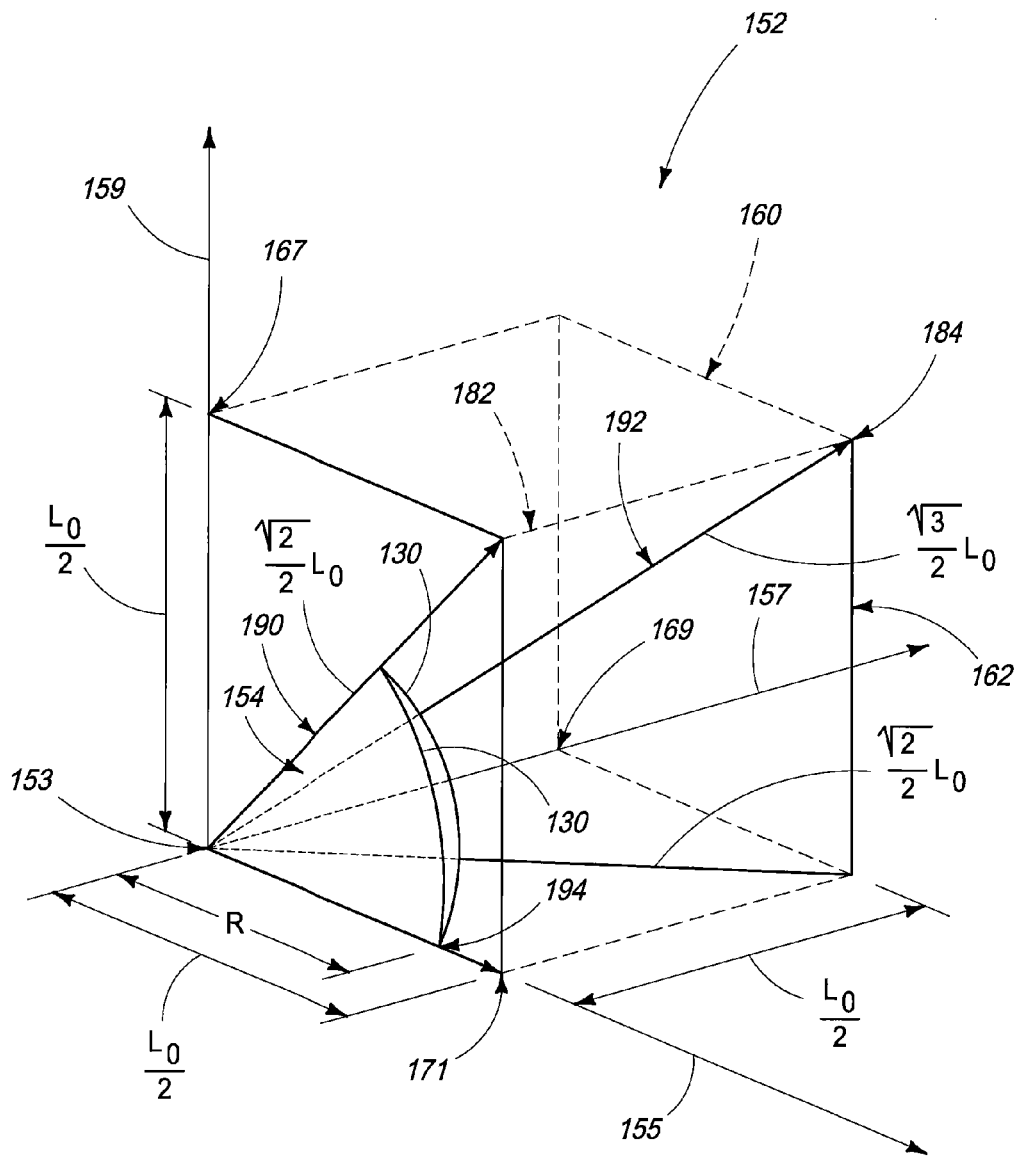
FIG. 22 shows a portion of the unit cell of FIG. 20, and shows calculated distances between various regions of the unit cell.

FIG. 22 shows an upper eighth of one of the unit cells 152. The axes 155, 157 and 159 are shown in FIG. 22, together with the locations 167, 169 and 171 to assist the reader in orienting the portion of FIG. 22 relative to the unit cell of FIG. 21.

FIG. 22 geometrically illustrates the different distances from the center 153 of the unit cell to the edge 182 of the unit cell (i.e., a distance illustrated with a segment 190), to the corner 184 of the unit cell (i.e., a distance illustrated with a segment 192), and to the location 171 in the center of a sidewall of the unit cell (i.e., a distance illustrated with a segment 194). FIG. 22 also illustrates the spherical core 154 as having a radius "R".

The length of segment 190 corresponds to a distance $D_{center-to-edge}$, the length of segment 192 corresponds to a distance $D_{center-to-corner}$, and the length of segment 194 corresponds to a distance $D_{center-to-sidewall}$. The distances $D_{center-to-edge}$, $D_{center-to-corner}$ and $D_{center-to-sidewall}$ may be calculated from the geometry of unit cell 152 (similar to the calculations discussed above with reference to FIG. 7), and may be related to the center-to-center distance $L_0$ between adjacent core structures (shown in FIG. 20). In the shown embodiment, the distance $D_{center-to-edge}$ is $$\frac{\sqrt{2}}{2}L_0,$$

the distance $D_{center-to-corner}$ is $$\frac{\sqrt{3}}{2}L_0$$

and the distance $D_{center-to-sidewall}$ is $$\frac{L_0}{2}.$$

FIG. 22 also geometrically illustrates the different distances from the interface 130 of the core structure 154 to the edge, corner and sidewall of the unit cell. The distance from center 153 to interface 130 is the radius "R" of the core structure. Thus, the distance from the interface 130 to the edge 182 is ($D_{center-to-edge}$-R), the distance from the interface 130 to the corner 184 is ($D_{center-to-corner}$-R), and the distance from the interface 130 to the sidewall (i.e., the distance to location 171) is ($D_{center-to-sidewall}$-R). Using the distances $D_{center-to-edge}$, $D_{center-to-corner}$ and $D_{center-to-sidewall}$ discussed above, the distance from interface 130 to edge 182 is $$\left(\frac{\sqrt{2}}{2}L_0 - R\right),$$

the distance from interface 130 to corner 184 is $$\left(\frac{\sqrt{3}}{2}L_0 - R\right)$$

and the distance from interface 130 to the sidewall is $$\left(\frac{L_0}{2} - R\right),$$

The distances discussed above may be utilized to calculate a distribution of lengths of the B subunit ($L_B$) in a manner analogous to that discussed above for determining the range of Equation 2. Specifically, the distribution of lengths $L_B$ for the copolymer that self-assembles into the cubic unit cells of FIGS. 20-22 should be such that the distribution encompasses the shortest distance from the interface 130 to a surface of the unit cell (which corresponds to the distance to the sidewall of $$\left(\frac{L_0}{2} - R\right)),$$

the longest distance from the interface 130 to a surface of the unit cell (which corresponds to the distance to the corner of $$\left(\frac{\sqrt{3}}{2}L_0 - R\right),$$

and the distances in between such shortest and longest distances. Thus, an optimal range for the distribution of lengths $L_B$ for a sphere-forming block copolymer that self-assembles into a cubic unit cell of the type shown in FIGS. 20-22 may be represented by Equation 5.

$$\left(\frac{L_0}{2} - R\right) \le L_B \le \left(\frac{\sqrt{3}}{2}L_0 - R\right) \qquad \text{Equation 5}$$

A distribution spanning the range of Equation 5 may be formed with any of the methods discussed above for forming the various distributions of Equations 1-4. The distribution of $L_B$ across the range of Equation 5 may be continuous in some embodiments, and may be discontinuous in other embodiments.

In some embodiments, the B subunit lengths $L_B$ may be uniform to the extent that the count of molecules per each of the individual lengths across the range of Equation 5 will all be within a factor of $10^6$ of one another, all within a factor of $10^5$ of one another, all within a factor of $10^4$ of one another, all within a factor of $10^3$ of one another, all within a factor of $10^2$ of one another, all within a factor of 10 of one another, or even all the same, or about the same, as one another. In some embodiments, the diblock copolymer composition may be provided to have a discontinuous distribution of lengths $L_B$ across the range of Equation 5, and yet the distribution across the range of Equation 5 is uniform (analogously to the discussion above with reference to FIG. 9) to the extent that at least 50% of the counts corresponding to the number of molecules per each of the individual lengths $L_B$ across the range are all within a given factor of one another, at least 60% of such counts are all within a given factor of one another, at least 70% of such counts are all within a given factor of one another, at least 80% of such counts are all within a given factor of one another, or at least 90% of such counts are all within a given factor of one another.

Figure 23:
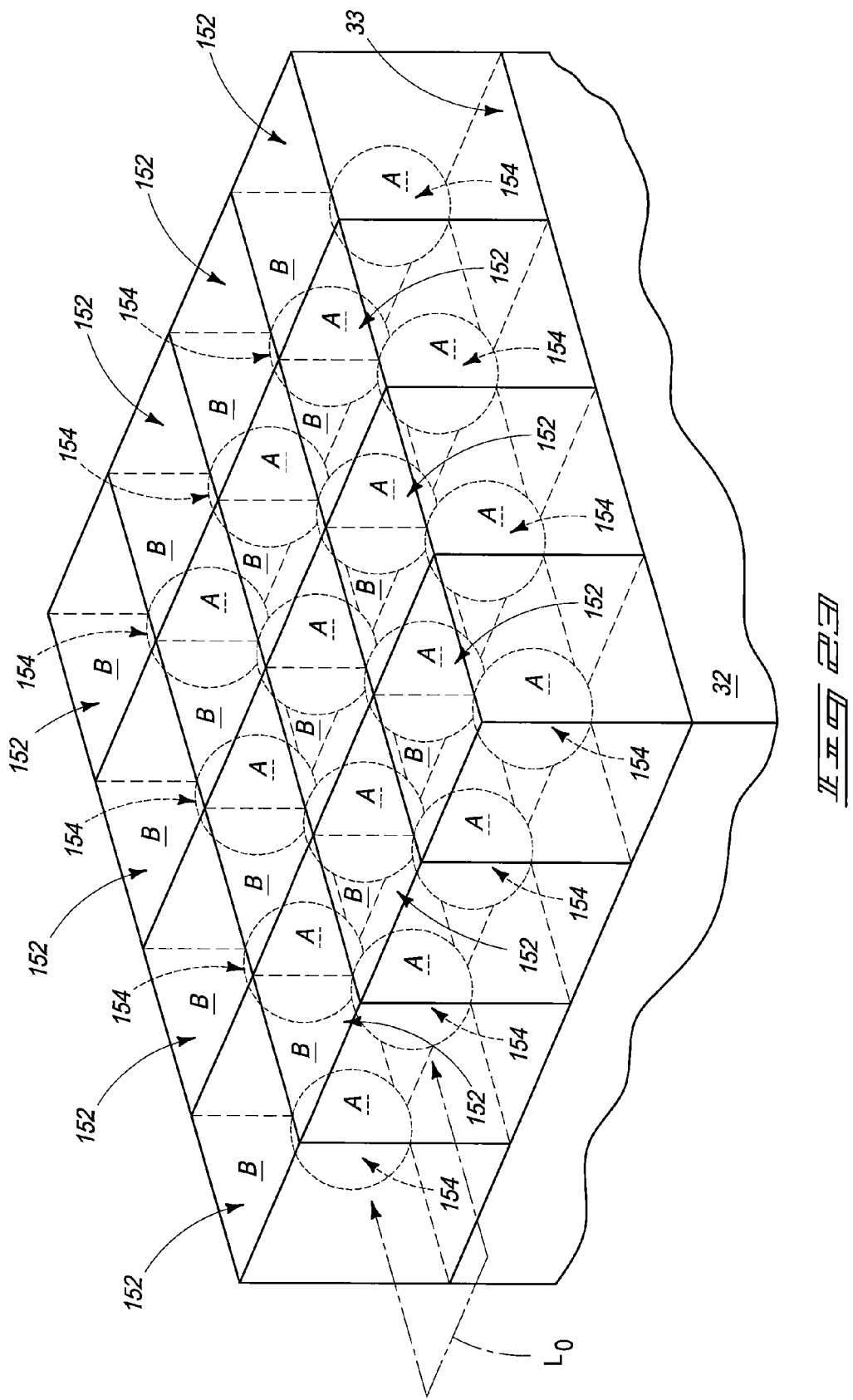
FIG. 23 is a three-dimensional view showing a diagrammatic representation of a construction comprising another pattern formed by self-assembly of a copolymer, and showing that the pattern may be considered to be arranged in unit cells.

The cubic unit cells of FIGS. 20-22 may be arranged in any of numerous orientations. FIG. 20 shows the unit cells arranged as a one-dimensional array. In contrast, FIG. 23 shows the unit cells arranged as a two-dimensional array (only some of the unit cells are labeled in FIG. 23). Each unit cell of the two-dimensional array may be considered to have a footprint over the underlying base 32 corresponding to the square area of the unit cell over the base. In the shown embodiment, such footprint has dimensions of about $4F^2$, where F is a minimum feature size, or half-pitch, within the repeating pattern of the unit cells. The two-dimensional array may be particularly applicable for fabrication of repeating circuit structures of memory arrays, such as, for example, cross-point memory structures.

The cubic unit cells of FIGS. 20-23 may be considered to have square trench cross-sections. In other embodiments, the chain length distribution of a block copolymer subunit may be modified to accommodate a trench geometry that has a cross-section other than square, such as, for example, a rectangular cross-section or a round-bottom cross-section.

The cubic unit cells of FIGS. 20-23 may be generated by assembling the block copolymer within or over a pre-pattern of appropriate surfaces across base 32. The pre-pattern may be topographical (i.e., graphoepitaxy) and/or chemical. In some embodiments, it may be desirable for a surface 33 of base 32 (and pre-formed sidewalls if graphoepitaxy is used) to preferentially wet a majority block (the B subunit block in the shown embodiment). In other embodiments, the surface 33 (and the sidewalls if sidewalls are utilized) may be neutral wetting relative to the majority and minority blocks, or may be preferentially wet by the minority block.

Figure 24:
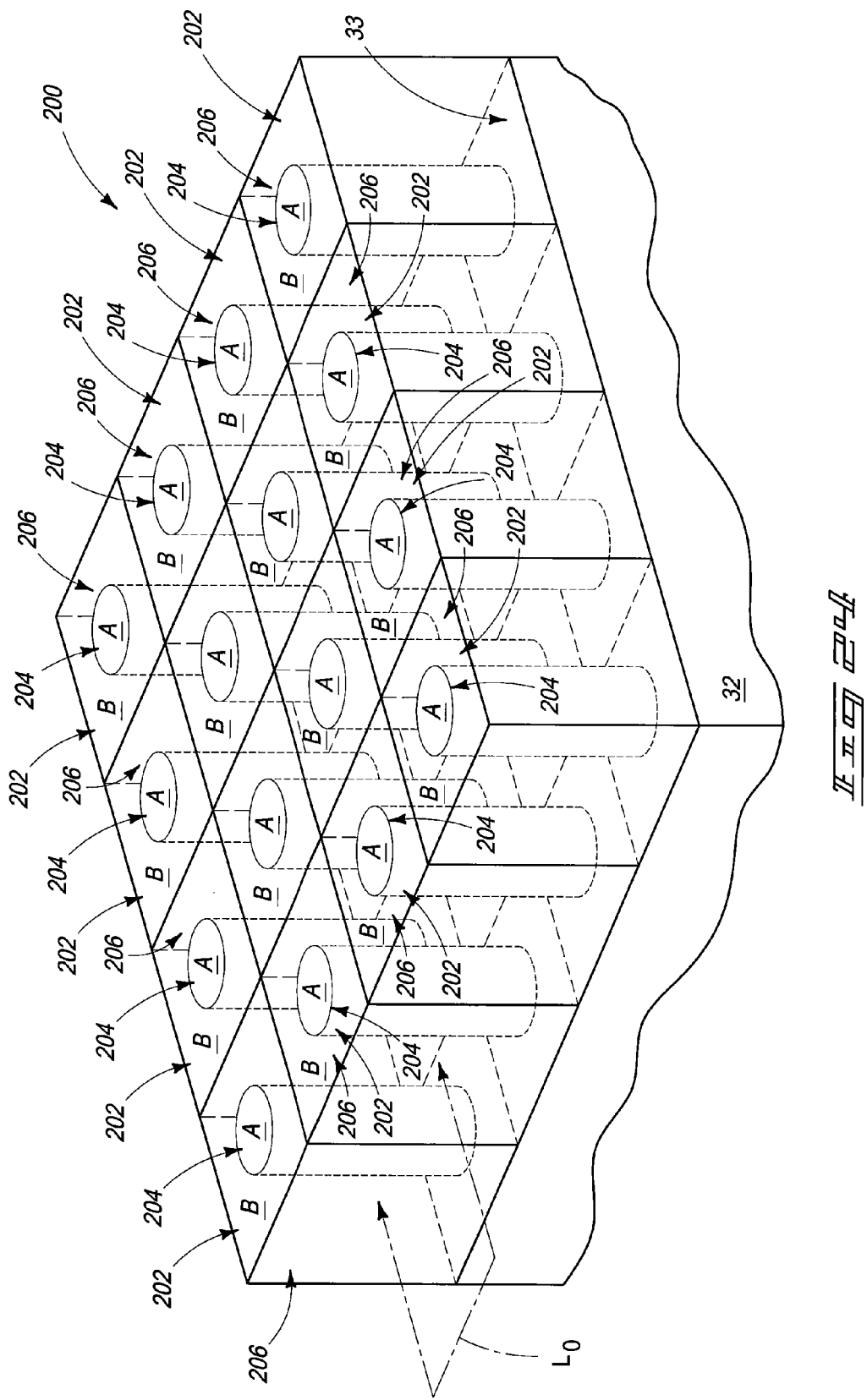
FIG. 24 is a three-dimensional view showing a diagrammatic representation of a construction comprising another pattern formed by self-assembly of a copolymer, and showing that the pattern may be considered to be arranged in unit cells.

FIG. 23 shows a two-dimensional array of cubic unit cells in which the core structures 154 correspond to spheres. In other embodiments, the core structures may have other shapes. For instance, FIG. 24 shows a construction 200 in which a two-dimensional array of cubic unit cells is formed over base 32, but in which the unit cells have cylindrical cores which are oriented perpendicular to the surface of base 32. In the shown embodiment, each of the cubic unit cells has about a $4F^2$ footprint overlying the underlying substrate, where F is a minimum feature size, or half-pitch, within the repeating pattern of the unit cells. The two-dimensional array may be particularly applicable for fabrication of repeating circuit structures of memory arrays, such as, for example, cross-point memory structures.

FIG. 24 shows a plurality of cubic unit cells 202 (only some of which are labeled) having cylindrical cores 204 (only some of which are labeled) contained therein. The unit cells have a center-to-center distance of $L_0$.

In the shown embodiment, the core structures 204 correspond to A subunits, and are surrounded by regions 206 (only some of which are labeled) corresponding to B subunits.

Figure 25:
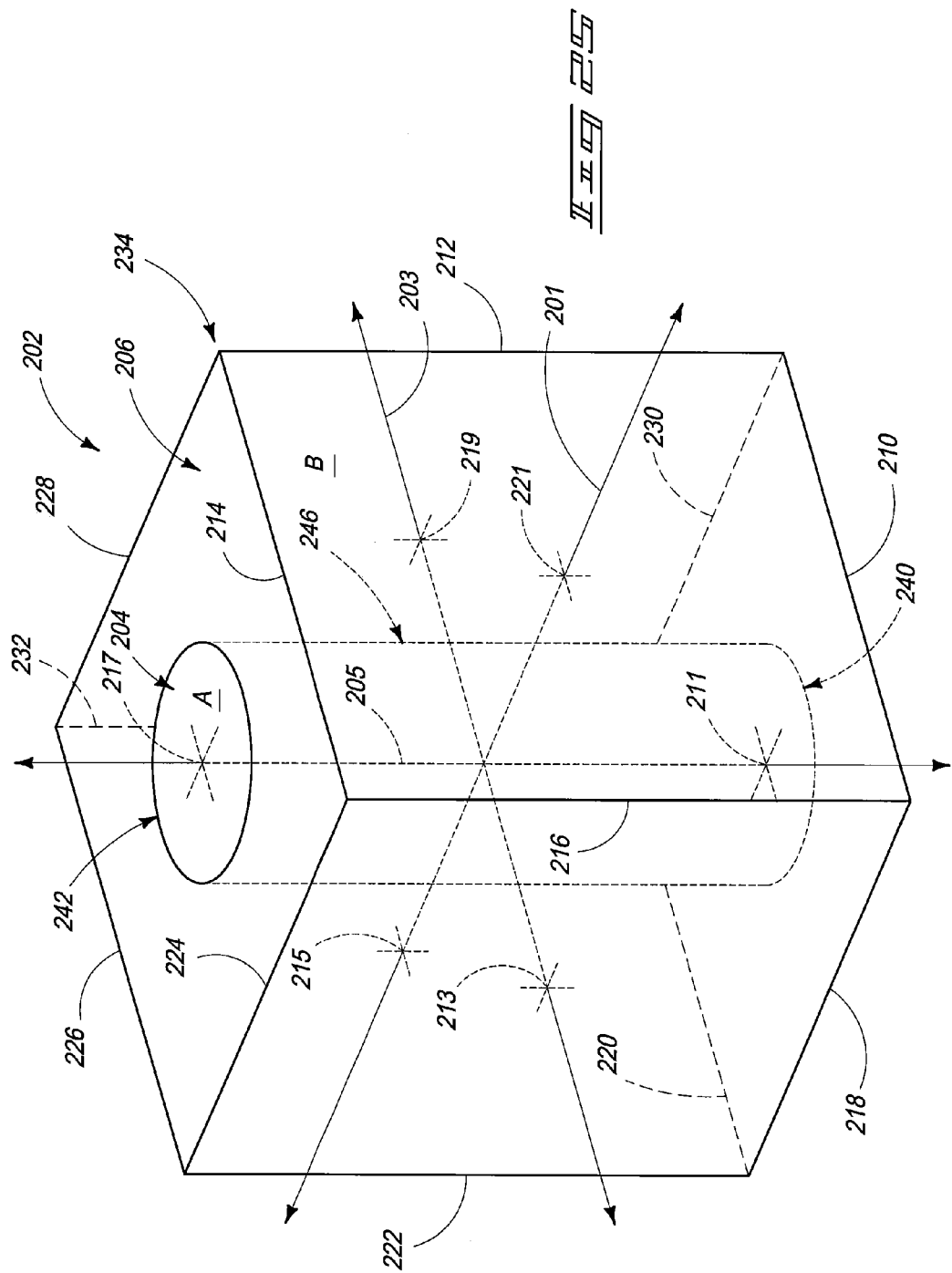
FIG. 25 is a three-dimensional view of one of the unit cells of FIG. 24. Three orthogonal axes are shown in FIG. 25, and crosses are provided at locations where the axes cross surfaces of the unit cell. The orthogonal axes and crosses are provided to assist the reader in visualizing the unit cell.

FIG. 25 shows a diagrammatic representation of one of the unit cells 202, and shows three orthogonal axes 201, 203 and 205 to assist the reader in visualizing the unit cell. The unit cell has edges 210, 212, 214, 216, 218, 220, 222, 224, 226, 228, 230 and 232; has corners where various of the edges meet with one another (for instance, the corner 234 where the edges 212, 214 and 228 meet), and has surfaces bounded by the edges. Locations where the axes cross the various surfaces of the unit cell are diagrammatically illustrated with the crosses 211, 213, 215, 217, 219 and 221. The cylindrical core structure 204 has a pair of ends 240 and 242, and an interface 246 defines a lateral sidewall surface extending between the ends.

Figure 26:
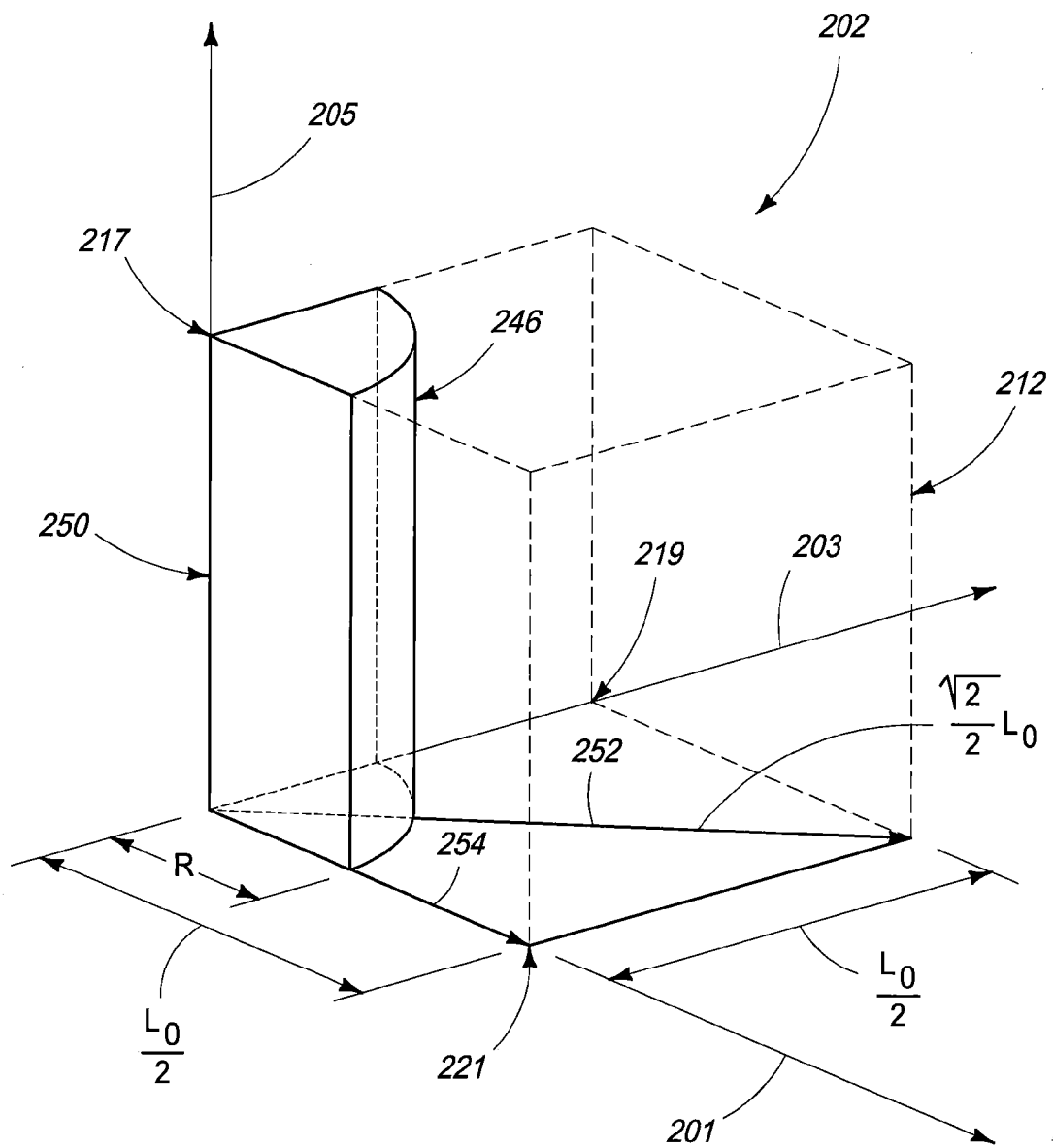
FIG. 26 shows a portion of the unit cell of FIG. 25, and shows calculated distances between various regions of the unit cell.

FIG. 26 shows an upper eighth of the unit cell 202. The axes 201, 203 and 205 are shown in FIG. 26, together with the locations 217, 219 and 221 to assist the reader in orienting the portion of FIG. 26 relative to the unit cell of FIG. 25.

FIG. 26 geometrically illustrates different distances from a center axis 250 of the unit cell (with such center axis being coextensive with the axis 205) to the edge 212 of the unit cell (i.e., a distance illustrated with a segment 252), and to the location 221 in the center of a sidewall of the unit cell (i.e., a distance illustrated with a segment 254). The location 221 is a location where the sidewall is nearest to the core 204. FIG. 26 also illustrates the cylindrical core as having a radius "R" within a cross-section through the cylinder.

The lengths of segments 252 and 254 may be calculated from the geometry of unit cell 202, and may be related to the center-to-center distance $L_0$ between adjacent core structures (shown in FIG. 24). In the shown embodiment, the length of segment 252 is $$\frac{\sqrt{2}}{2} L_0,$$

and the length of segment 254 is $$\frac{L_0}{2}.$$

FIG. 26 also geometrically illustrates the different distances from the interface 246 of the core structure 204 to the edge 212 of the unit cell (which is a longest distance spanned by a B subunit of block copolymer), and from the interface 246 to the sidewall location 221 of the unit cell (which is a shortest distance spanned by a B subunit of block copolymer). The distance from the interface 246 to the edge 212 is $$\left(\frac{\sqrt{2}}{2} L_0 - R\right),$$

and the distance from the interface 246 to location 221 is $$\left(\frac{L_0}{2} - R\right).$$

The distances discussed above may be utilize to calculate a desired distribution of lengths of the B subunit ($L_B$) in a manner analogous to the that discussed above for determining the range of Equation 2. Specifically, the distribution of lengths $L_B$ for the copolymer that self-assembles into a cubic unit cell of FIGS. 24-26 should be such that the distribution encompasses the shortest distance from the interface 246 to a surface of the unit cell (which corresponds to the distance of $$\left(\frac{L_0}{2} - R\right),$$

the longest distance from the interface 246 to a surface of the unit cell (which corresponds to the distance of $$\left(\frac{\sqrt{2}}{2}L_0 - R\right),$$

and the distances in between such shortest and longest distances. Thus, an optimal distribution of lengths $L_B$ for a copolymer that self-assembles into a cubic unit cell of the type shown in FIGS. 24-26 may be represented by Equation 6.

$$\left(\frac{L_0}{2} - R\right) \le L_B \le \left(\frac{\sqrt{2}}{2}L_0 - R\right) \qquad \text{Equation 6}$$

The distribution of Equation 6 may be formed with any of the methods discussed above for forming the various distributions of Equations 1-5. The distribution of $L_B$ across the range of Equation 6 may be continuous in some embodiments, and may be discontinuous in other embodiments.

In some embodiments, the B subunit lengths $L_B$ may be uniform to the extent that the count of molecules per each of the individual lengths across the range of Equation 6 will all be within a factor of $10^6$ of one another, all within a factor of $10^5$ of one another, all within a factor of $10^4$ of one another, all within a factor of $10^3$ of one another, all within a factor of $10^2$ of one another, all within a factor of 10 of one another, or even all the same, or about the same, as one another. In some embodiments, the diblock copolymer composition may be provided to have a discontinuous distribution of lengths $L_B$ across the range of Equation 6, and yet the distribution across the range of Equation 6 is uniform (analogously to the discussion above with reference to FIG. 9) to the extent that at least 50% of the counts corresponding to the number of molecules per each of the individual lengths $L_B$ across the range are all within a given factor of one another, at least 60% of such counts are all within a given factor of one another, at least 70% of such counts are all within a given factor of one another, at least 80% of such counts are all within a given factor of one another, or at least 90% of such counts are all within a given factor of one another.

The cubic unit cells of FIGS. 24-26 may be generated by assembling the block copolymer within or over a pre-pattern of appropriate surfaces across base 32 (FIG. 24). The pre-pattern may be topographical (i.e., graphoepitaxy) and/or chemical. In some embodiments, it may be desirable for a surface 33 of base 32 (and pre-formed sidewalls if graphoepitaxy is used) to preferentially wet a majority block (the B subunit block in the shown embodiments). In other embodiments, the surface 33 (and sidewalls if sidewalls are utilized) may be neutral wetting relative to the majority and minority blocks, or may be preferentially wet by the minority block.

FIGS. 27-30 describe another arrangement of unit cells that may be formed by self-assembly of block copolymer, and describe a method of determining an optimal distribution of subunit lengths of the block copolymer.

Figure 27:
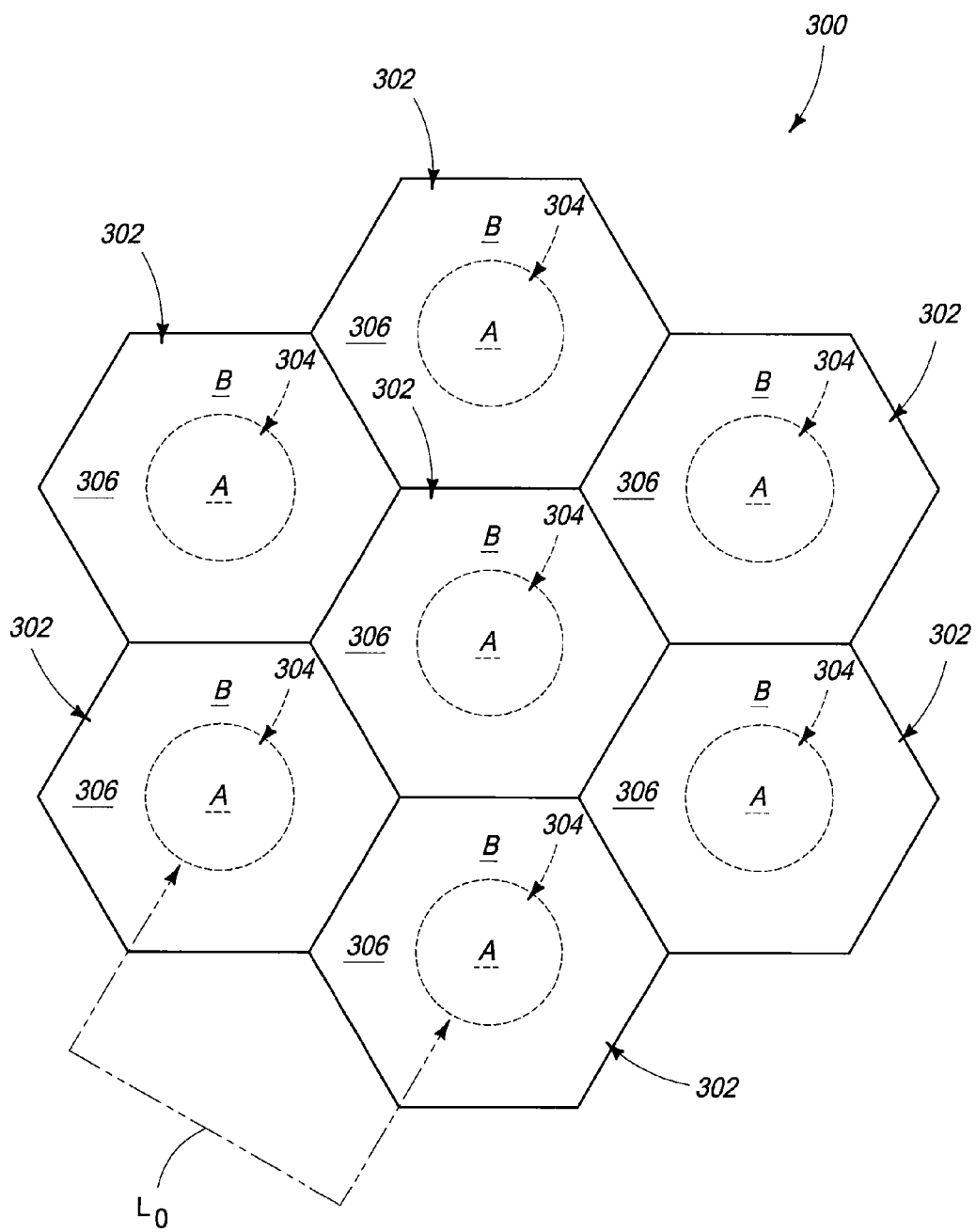
FIG. 27 is cross-sectional top view showing a diagrammatic representation of a construction comprising a pattern formed by self-assembly of a copolymer, and showing that the pattern may be considered to be arranged in unit cells.

FIG. 27 shows a top view of a construction 300 in which a two-dimensional array of hexagonal unit cells 302 is formed over base 32 (the base is not visible in the top view of FIG. 27). The unit cells have spherical cores 304 corresponding to an A subunit of the self-assembled block copolymer, and such cores are surrounded by regions 306 corresponding to a B subunit of the block copolymer. The unit cells have a center-to-center distance of $L_0$ corresponding to a pitch of the repeating structures of the self-assembled configuration.

Figure 28:
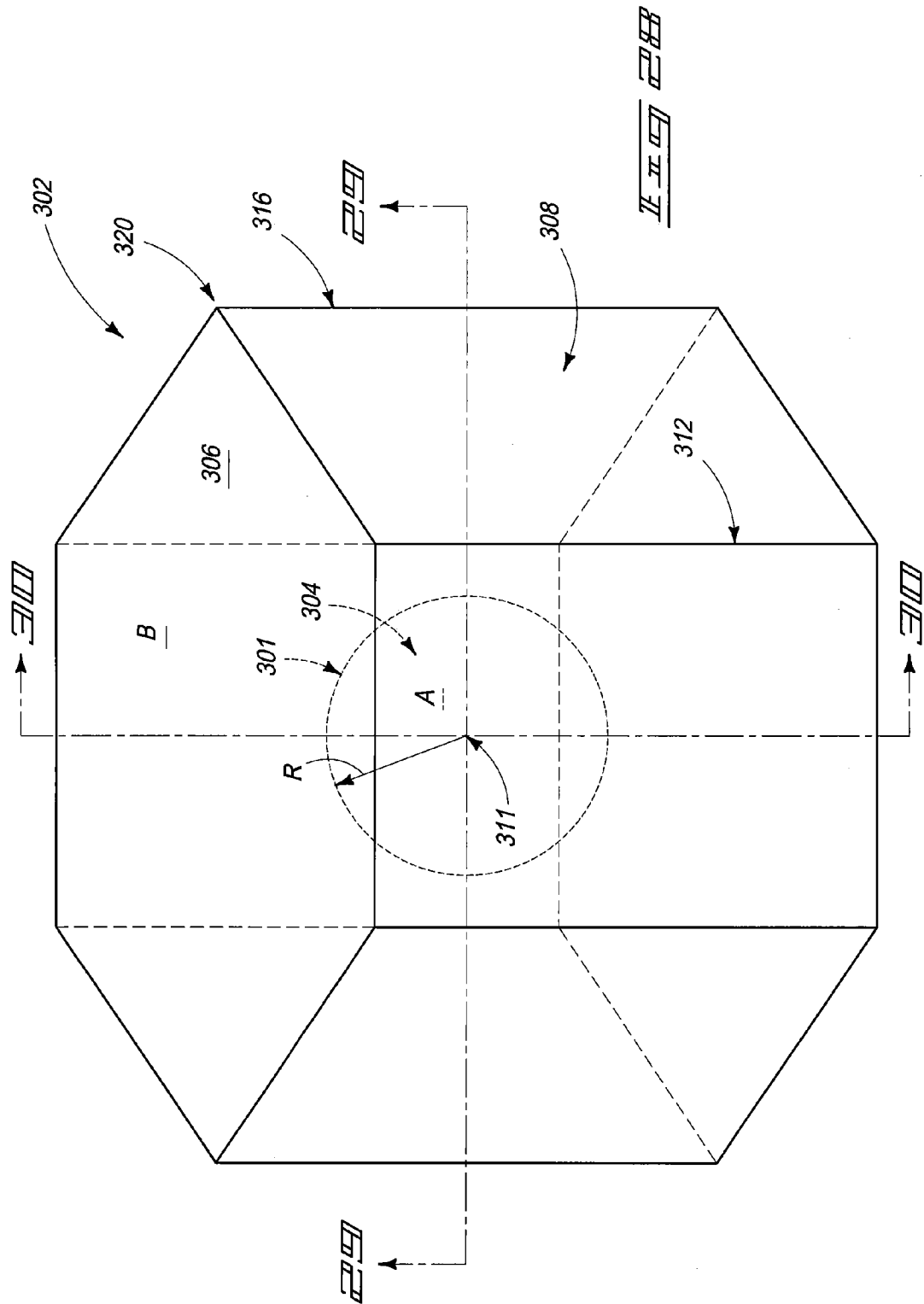
FIG. 28 is a three-dimensional view of one of the unit cells of FIG. 27.

One of the unit cells 302 is illustrated in three-dimensional view in FIG. 28. The unit cell is hexagonal columnar in shape, and has the spherical core 304 contained therein. The spherical core has a radius "R".

Figure 29:
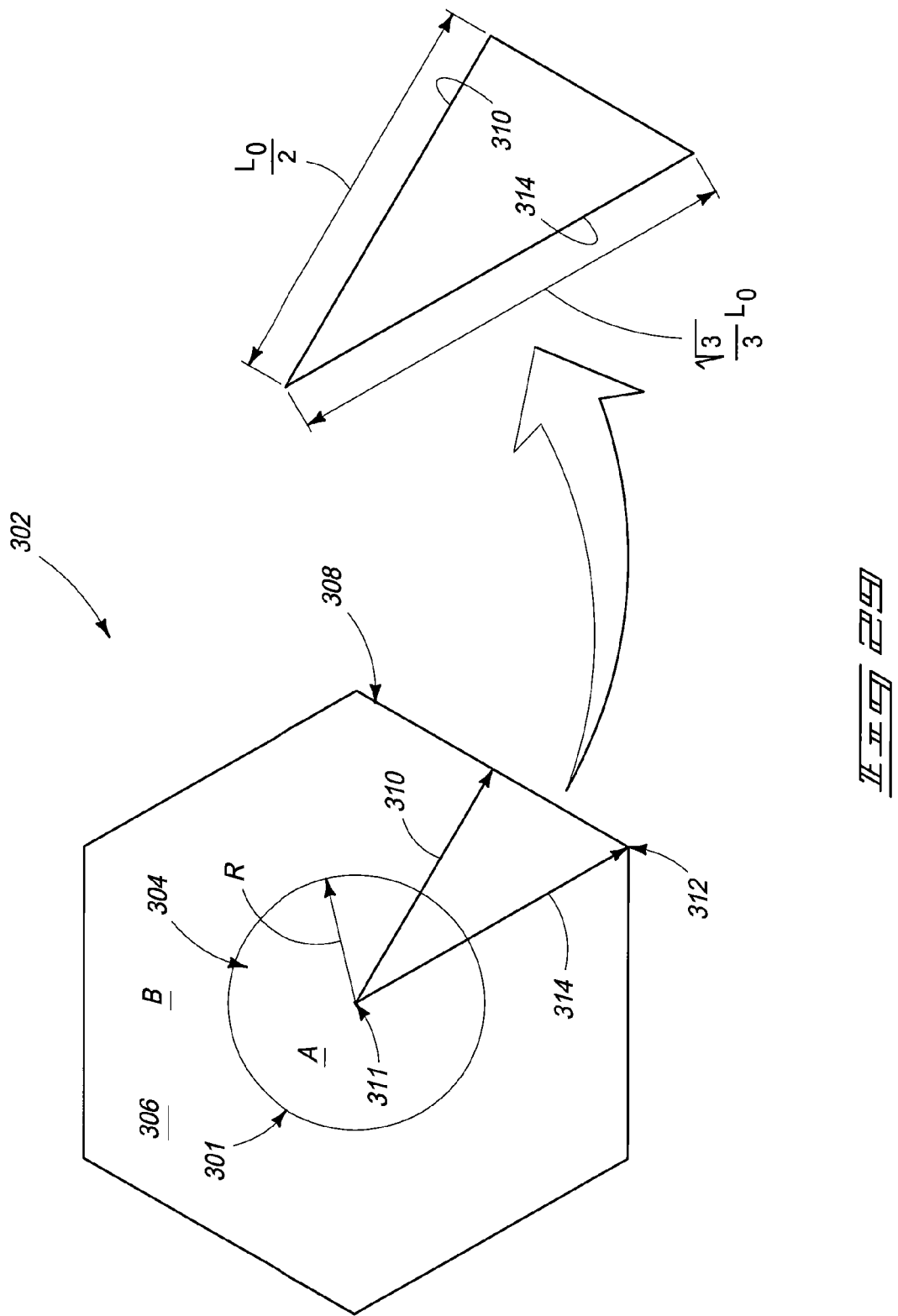
FIG. 29 shows a cross-sectional top view of the unit cell of FIG. 28, and shows an expanded portion of the view to illustrate calculated distances between various regions of the unit cell. The cross-sectional top view of FIG. 29 is along the line 29-29 of FIG. 28.
Figure 30:
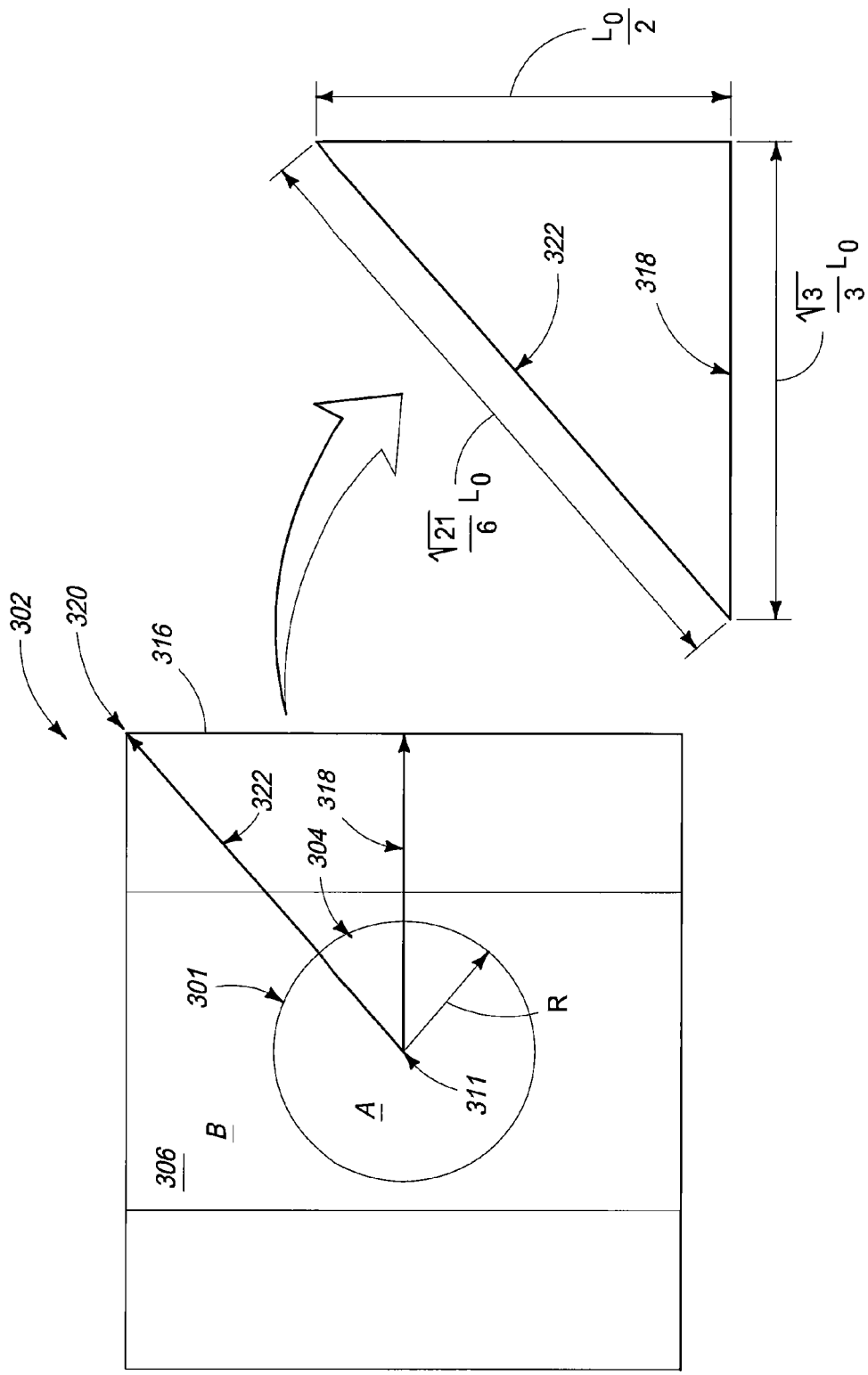
FIG. 30 shows a cross-sectional side view of the unit cell of FIG. 28, and shows an expanded portion of the view to illustrate calculated distances between various regions of the unit cell. The cross-sectional side view of FIG. 30 is along the line 30-30 of FIG. 28.

FIGS. 29 and 30 shows a top view cross-sectional view and side cross-sectional view, respectively, of the unit cell 302, and geometrically illustrate different distances from a center 311 of the unit cell to surfaces, edges and corners of the unit cell.

Specifically, FIG. 29 illustrates distances from the center of the unit cell to a surface 308 (i.e., a distance illustrated with a segment 310), and to an edge 312 (i.e., a distance illustrated with a segment 314). FIG. 30 illustrates distances from the center of the unit cell to an edge 316 (i.e., a distance illustrated with a segment 318), and to a corner 320 (i.e., a distance illustrated with a segment 322).

The lengths of segments 310, 314, 318 and 322 may be calculated from the geometry of unit cell 302, and may be related to the center-to-center distance $L_0$ between adjacent core structures (shown in FIG. 27). In the shown embodiment, the length of segment 310 is $$\frac{L_0}{2},$$

the length of segment 314 is $$\frac{\sqrt{3}}{3}L_0,$$

the length of segment 318 is $$\frac{\sqrt{3}}{3}L_0,$$

and the length of segment 322 is $$\frac{\sqrt{21}}{6}L_0.$$

Thus the longest segment is 322, and the shortest segment is 310.

An interface 301 defines an outer boundary of the core structure 304, and the distances from the interface 301 to the various edges, corners and surfaces of the unit cell are the lengths of the segments 310, 314, 318 and 322 minus R. Such distances from the interface 301 to the various edges corners and surfaces correspond to the distances spanned by a B subunit of block copolymer. Accordingly, the longest distance spanned by a B subunit of block copolymer in unit cell 302 is $$\left(\frac{\sqrt{21}}{6}L_0 - R\right),$$

and the shortest distance spanned by a B subunit of block copolymer in unit cell 302 is $$\left(\frac{L_0}{2} - R\right).$$

The distances discussed above may be utilize to calculate a desired distribution of lengths of the B subunit ($L_B$) in a manner analogous to the that discussed above for determining the range of Equation 2. Specifically, the distribution of lengths $L_B$ for the copolymer that self-assembles into hexagonal columnar unit cell of FIGS. 27-30 should be such that the distribution encompasses the shortest distance from the interface 301 to a surface of the unit cell (which corresponds to the distance of $$\left(\frac{L_0}{2} - R\right)),$$

the longest distance from the interface 301 to a surface of the unit cell (which corresponds to the distance of $$\left(\frac{\sqrt{21}}{6}L_0 - R\right)),$$

and the distances in between such shortest and longest distances. Thus, an optimal distribution of lengths $L_B$ for a copolymer that self-assembles into a hexagonal columnar unit cell of the type shown in FIGS. 27-30 may be represented by Equation 7.

$$\left(\frac{L_0}{2} - R\right) \le L_B \le \left(\frac{\sqrt{21}}{6}L_0 - R\right) \quad \text{Equation 7}$$

The distribution of Equation 7 may be formed with any of the methods discussed above for forming the various distributions of Equations 1-6. The distribution of $L_B$ across the range of Equation 7 may be continuous in some embodiments, and may be discontinuous in other embodiments.

In some embodiments, the B subunit lengths $L_B$ may be uniform to the extent that the count of molecules per each of the individual lengths across the range of Equation 7 will all be within a factor of $10^6$ of one another, all within a factor of $10^5$ of one another, all within a factor of $10^4$ of one another, all within a factor of $10^3$ of one another, all within a factor of $10^2$ of one another, all within a factor of 10 of one another, or even all the same, or about the same, as one another. In some embodiments, the diblock copolymer composition may be provided to have a discontinuous distribution of lengths $L_B$ across the range of Equation 7, and yet the distribution across the range of Equation 7 is uniform (analogously to the discussion above with reference to FIG. 9) to the extent that at least 50% of the counts corresponding to the number of molecules per each of the individual lengths $L_B$ across the range are all within a given factor of one another, at least 60% of such counts are all within a given factor of one another, at least 70% of such counts are all within a given factor of one another, at least 80% of such counts are all within a given factor of one another, or at least 90% of such counts are all within a given factor of one another.

The hexagonal columnar cells of FIGS. 27-30 may be generated with any suitable method, such as, for example, by creating a pre-pattern of appropriate surfaces across a base. The pre-pattern may be topographical (i.e., graphoepitaxy) and/or chemical.

Although the A subunit distributions were not specifically described during the discussions above regarding the various embodiments of FIGS. 20-30, the A subunit distributions may be any suitable distributions, and in some embodiments may be of the type described above with reference to Equation 3 and FIG. 15.

The various patterns of unit cells described in the figures above may be used to create patterned masks. Such masks may be used in any of numerous applications, including, for example, in semiconductor processing. An example method of forming and using a patterned mask is described with reference to FIGS. 31-34. In other embodiments, the block copolymer domains may form active electronic components within electronic devices like integrated circuits, sensors, optoelectronic, photonic, or nanofluidic devices. Alternatively, the block copolymer domains may contain active elements, such as nanoparticles, quantum dots, or nanowires, which have been selectively incorporated within one, the other, or both domains. In yet other embodiments, the block copolymer domains may contain functional precursors, e.g. catalyst species, from which active elements are grown, or on which active elements are deposited.

FIG. 31 shows a portion of the construction 200 that was described above with reference to FIG. 24. The construction 200 has alternating regions 204 and 206 of A subunits and B subunits, respectively, of self-assembled block copolymer. One of the regions 204 and 206 may be selectively removed relative to the other to form a patterned mask. For instance, FIG. 32 shows a patterned mask 401 resulting from the selective removal of regions 206. The patterned mask 401 comprises spaced apart regions 204.

Referring to FIG. 33, the patterned mask may be used during implanting of dopant 403 into base 32, to create a patterned of doped regions 400 within the base. Alternatively, or additionally, the patterned mask may be used in accordance with a process of FIG. 34 whereby the mask protects regions of base 32 during etching into base 32. The mask is thus used to create a pattern of recessed regions 402 within the base.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a pattern across a base, comprising:
providing a block copolymer composition across a surface of the base, the block copolymer composition comprising subunits A and B; the A subunits having lengths designated as $L_A$; the B subunits having lengths designated as $L_B$; the block copolymer composition ultimately being used to form core structures spaced center-to-center by a distance of $L_0$; the core structures having an average center-to-interface distance of R; the lengths $L_B$ being distributed across a range defined by, $$\left(\frac{L_0}{2} - R\right) \leq L_B \leq \left(\frac{\sqrt{2}}{2} L_0 - R\right);$$

said distribution comprising a count of molecules per each of the individual lengths $L_B$ across the range; at least 50% of the counts being within a factor of $10^6$ of one another; and inducing self-assembly within the block copolymer composition to form a plurality of the core structures, with adjacent core structures of said plurality being spaced center-to-center by $L_0$.

2. The method of claim 1 wherein at least 70% of the counts across said range are within the factor of $10^6$ of one another.

3. The method of claim 1 wherein at least 80% of the counts across said range are within the factor of $10^6$ of one another.

4. The method of claim 1 wherein at least 90% of the counts across said range are within the factor of $10^6$ of one another.

5. The method of claim 1 wherein all of the counts across said range are within the factor of $10^6$ of one another.

6. The method of claim 5 wherein all of the counts across said range are within a factor of $10^3$ of one another.

7. The method of claim 5 wherein all of the counts across said range are within a factor of 10 of one another.

8. The method of claim 5 wherein all of the counts across said range are about the same as one another.

9. The method of claim 1 wherein the self-assembled block copolymer composition is arranged as a two-dimensional array of unit cells across the substrate, with each unit cell having an approximately square footprint over the substrate, and with the core structures being cylinders extending perpendicular to the surface of the substrate.

10. The method of claim 1 wherein the core structures are circular along a cross-section through a center of the core structures; wherein the A subunits are within the circular core structures; wherein a radius of the circular cross-section of the core structures corresponds to the distance R, and wherein a distribution of lengths of the A subunits ($L_A$), is substantially uniform across a range defined by $0.1R \leq L_A \leq R$.

11. The method of claim 1 wherein the self-assembled block copolymer contains active elements or functional precursors.

12. A method of forming a pattern across a base, comprising:

providing a block copolymer composition across a surface of the base, the block copolymer composition comprising subunits A and B; the A subunits having lengths designated as $L_A$; the B subunits having lengths designated as $L_B$; the block copolymer composition ultimately being used to form linear structures spaced center-to-center by a distance of $L_0$; the linear structures having an average center-to-interface distance of R; the lengths $L_B$ being distributed across a range defined by, $$\left(\frac{L_0}{2} - R\right) \leq L_B \leq \left(\frac{\sqrt{3}}{3} L_0 - R\right);$$

said distribution comprising a count of molecules per each of the individual lengths $L_B$ across the range; at least 50% of the counts being within a factor of $10^6$ of one another; and inducing self-assembly within the block copolymer composition to form a plurality of the linear structures extending primarily normal to the surface of the base; adjacent linear structures of said plurality being spaced center-to-center by $L_0$.

13. The method of claim 12 wherein all of the counts across said range are within a factor of 10 of one another.

14. The method of claim 12 wherein the lengths $L_B$ form a continuous distribution across said range.

15. The method of claim 12 wherein the lengths $L_B$ form a discontinuous distribution across said range.

16. The method of claim 12 wherein the linear structures are cylinders.

17. A method of forming and using a pattern across a semiconductor substrate, comprising:

providing a block copolymer composition across the semiconductor substrate, the block copolymer composition comprising subunits A and B; the A subunits having lengths designated as $L_A$; the B subunits having lengths designated as $L_B$; the block copolymer composition ultimately being used to form core structures by inducing self-assembly of the block copolymer; such core structures being spaced center-to-center by a distance of $L_0$; the core structures having an average center-to-interface distance of R;

the self-assembly creating the core structures to be of the subunit A, and creating surrounding regions that contain the subunit B; the core structures and surrounding regions together being a repeating pattern and being contained within polygonal unit cells, the polygonal unit cells having two-dimensional cross-sections extending therethrough; an individual cross-section through a center of a unit cell having a core region surrounded by a polygonal shape;

a distance $D_{center-to-sidewall}$ being a distance from a center of the individual polygonal unit cell to a sidewall of the polygonal shape;

a distance $D_{center-to-corner}$ being a distance from the center of the polygonal unit cell to a corner of the polygonal shape;

the composition being formulated to have a distribution of lengths $L_B$ across a range defined by, $$[(D_{center-to-sidewall}) - R] \leq L_B \leq [(D_{center-to-corner}) - R];$$

said distribution comprising a count of molecules per each of the individual lengths $L_B$ across the range; at least 50% of the counts being within a factor of $10^6$ of one another;

inducing the self-assembly to form a plurality of the core structures, adjacent core structures of said plurality being spaced center-to-center by $L_0$; and using one or both of the core structures and surrounding regions as a mask during at least one of an etch into the semiconductor substrate and an implant of dopant into the semiconductor substrate.

18. The method of claim 17 wherein all of the counts across said range are within a factor of $10^3$ of one another.

19. The method of claim 17 wherein the core structures are linear and extend parallel to the surface of the substrate.

20. The method of claim 17 wherein the core structures are linear and extend normal to the surface of the substrate.

21. The method of claim 17 wherein the individual polygonal shape is a square.

22. The method of claim 17 wherein the individual polygonal shape is a hexagon.

23. The method of claim 17 wherein the block copolymer has the formula A-B.

24. The method of claim 17 wherein the block copolymer has the formula B-A.

25. A method of forming a pattern across a base, comprising:
   providing a block copolymer composition across a surface of the base, the block copolymer composition comprising subunits A and B; the A subunits having lengths designated as $L_A$; the B subunits having lengths designated as $L_B$; the block copolymer composition ultimately being used to form core structures spaced center-to-center by a distance of $L_0$; the core structures having an average center-to-interface distance of R; the lengths $L_B$ being distributed across a range defined by, $$\left(\frac{L_0}{2} - R\right) \leq L_B \leq \left(\frac{\sqrt{3}}{2}L_0 - R\right);$$

said distribution comprising a count of molecules per each of the individual lengths $L_B$ across the range; at least 50% of the counts being within a factor of $10^6$ of one another; and
   inducing self-assembly within the block copolymer composition to form a plurality of the core structures, with adjacent core structures of said plurality being spaced center-to-center by $L_c$.

26. The method of claim 25 wherein all of the counts across said range are within a factor of $10^3$ of one another.

27. The method of claim 25 wherein the self-assembled block copolymer composition is arranged as a two-dimensional array of unit cells across the substrate, with each unit cell being cubic, and with the core structures being spheres contained within the cubic unit cells.

28. A method of forming a pattern across a base, comprising:
   providing a block copolymer composition across a surface of the base, the block copolymer composition comprising subunits A and B; the A subunits having lengths designated as $L_A$; the B subunits having lengths designated as $L_B$; the block copolymer composition ultimately being used to form core structures spaced center-to-center by a distance of $L_0$; the core structures having an average center-to-interface distance of R; the lengths $L_B$ being distributed across a range defined by, $$\left(\frac{L_0}{2} - R\right) \leq L_B \leq \left(\frac{\sqrt{21}}{6}L_0 - R\right);$$

said distribution comprising a count of molecules per each of the individual lengths $L_B$ across the range; at least 50% of the counts being within a factor of $10^6$ of one another; and
   inducing self-assembly within the block copolymer composition to form a plurality of the core structures, with adjacent core structures of said plurality being spaced center-to-center by $L_0$.

29. The method of claim 28 wherein all of the counts across said range are within a factor of $10^3$ of one another.

30. A method of forming and using a pattern across a semiconductor substrate, comprising:
   providing a block copolymer composition across the semiconductor substrate, the block copolymer composition comprising subunits A and B; the A subunits having lengths designated as $L_A$; the B subunits having lengths designated as $L_B$; the block copolymer composition ultimately being used to form core structures by inducing self-assembly of the block copolymer; such core structures being spaced center-to-center by a distance of $L_a$; the core structures having an average center-to-interface distance of R;
   the self-assembly creating the core structures to be of the subunit A, and creating surrounding regions that contain the subunit B; the core structures and surrounding regions together being a repeating pattern and being contained three-dimensional polygonal unit cells;
   a distance $D_{center-to-sidewall}$ being a distance from a center of a three-dimensional polygonal unit cell to a sidewall of the three-dimensional polygonal unit cell;
   a distance $D_{center-to-corner}$ being a distance from the center of the three-dimensional polygonal unit cell to a corner of the three-dimensional polygonal unit cell;
   the composition being formulated to have a distribution of lengths $L_B$ that is across a range defined by, $$[(D_{center-to-sidewall})-R] \leq L_B \leq [(D_{center-to-corner})-R];$$

said distribution comprising a count of molecules per each of the individual lengths $L_B$ across the range; at least 50% of the counts being within a factor of $10^6$ of one another;
   inducing the self-assembly to form a plurality of the core structures, adjacent core structures of said plurality being spaced center-to-center by $L_0$; and
   using one or both of the core structures and surrounding regions as a mask during at least one of an etch into the semiconductor substrate and an implant of dopant into the semiconductor substrate.

31. The method of claim 30 wherein all of the counts across said range are within a factor of $10^3$ of one another.

32. The method of claim 30 wherein all of the counts across said range are within a factor of 10 of one another.

33. The method of claim 30 wherein the core structures are spherical micelles in a cubical unit cell.

34. The method of claim 30 wherein the core structures are spherical micelles in a hexagonal columnar unit cell.

35. A method of forming a pattern across a base, comprising:
   providing a block copolymer composition across a surface of the base, the block copolymer composition comprising subunits A and B; the A subunits having lengths designated as $L_A$; the block copolymer composition ultimately being used to form core structures spaced center-to-center by a distance of $L_0$; the core structures having an average center-to-interface distance of R, with the interface being an interface between A subunits of the core and B subunits of regions surrounding the cores; the lengths $L_A$ being distributed across a range defined by, $$0.1R \leq L_A \leq R;$$

said distribution comprising a count of molecules per each of the individual lengths $L_A$ across the range; at least 50% of the counts being within a factor of $10^6$ of one another; and
   inducing self-assembly within the block copolymer composition to form a plurality of the core structures.

* * * * *

UNITED STATES PATENT AND TRADEMARK OFFICE
CERTIFICATE OF CORRECTION

PATENT NO.        : 8,268,732 B2
APPLICATION NO.   : 12/621768
DATED             : September 18, 2012
INVENTOR(S)       : Scott Sills It is certified that error appears in the above-identified patent and that said Letters Patent is hereby corrected as shown below:

On the face page, in field (73), in "Assignee", in column 1, line 1, delete "Boise, IA" and insert -- Boise, ID --, therefor.

In column 30, line 37, in Claim 17, delete "$D_{eenter-to-corner}$" and insert -- $D_{center-to-corner}$ --, therefor.

In column 31, line 25, in Claim 25, delete "$L_c$." and insert -- $L_0$. --, therefor.

In column 32, line 5, in Claim 30, delete "$L_a$;" and insert -- $L_0$; --, therefor.

Signed and Sealed this
Twentieth Day of November, 2012

David J. Kappos
*Director of the United States Patent and Trademark Office*